(12) United States Patent
Lee et al.

(10) Patent No.: US 11,089,682 B2
(45) Date of Patent: Aug. 10, 2021

(54) FLEXIBLE CIRCUIT BOARD, CHIP PACKAGE INCLUDING THE SAME, AND ELECTRONIC DEVICE INCLUDING THE CHIP PACKAGE

(71) Applicant: LG INNOTEK CO., LTD., Seoul (KR)

(72) Inventors: Seung Jin Lee, Seoul (KR); Hyung Kyu Yoon, Seoul (KR); Hye Yeong Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 18 days.

(21) Appl. No.: 16/564,689

(22) Filed: Sep. 9, 2019

(65) Prior Publication Data
US 2020/0084888 A1    Mar. 12, 2020

(30) Foreign Application Priority Data
Sep. 12, 2018   (KR) ........................ 10-2018-0109253

(51) Int. Cl.
*H05K 1/02*     (2006.01)
*H05K 1/03*     (2006.01)
(Continued)

(52) U.S. Cl.
CPC .......... *H05K 1/118* (2013.01); *H01L 23/4985* (2013.01); *H01L 23/49838* (2013.01);
(Continued)

(58) Field of Classification Search
CPC ... H05K 1/11; H05K 1/16; H05K 1/18; H05K 1/115; H05K 1/185; H05K 3/00;
(Continued)

(56) References Cited

U.S. PATENT DOCUMENTS

| | | | |
|---|---|---|---|
| 4,131,516 A | * | 12/1978 | Bakos .................... H05K 3/328 |
| | | | 205/125 |
| 6,448,644 B1 | * | 9/2002 | Lin ........................ H01L 21/486 |
| | | | 205/123 |

(Continued)

FOREIGN PATENT DOCUMENTS

| KR | 10-2017-0135601 | 12/2017 |
|---|---|---|
| KR | 10-2018-0070286 | 6/2018 |
| KR | 10-2018-0076995 | 7/2018 |

*Primary Examiner* — Xiaoliang Chen
(74) *Attorney, Agent, or Firm* — KED & Associates LLP

(57) ABSTRACT

According to an embodiment, a flexible circuit board includes: a first substrate; a second substrate disposed on the first substrate and including an opening; a first conductive pattern part disposed on a bottom surface of the first substrate; a second conductive pattern part disposed on a top surface of the second substrate; a third conductive pattern part disposed between the first substrate and the second substrate; and an upper protective layer partially disposed on the second conductive pattern part and including a first open region, wherein the third conductive pattern part includes: a first inner lead pattern part disposed in the opening of the second substrate; and a first extension pattern part connected to the first inner lead pattern part, the second conductive pattern part includes: a second inner lead pattern part disposed in the first open region of the upper protective layer; and a second extension pattern part connected to the second inner lead pattern part, and a number of first inner lead pattern parts is greater than a number of second inner lead pattern parts.

16 Claims, 28 Drawing Sheets

(51) Int. Cl.
    *H05K 1/11* (2006.01)
    *H05K 1/16* (2006.01)
    *H05K 1/18* (2006.01)
    *H05K 3/00* (2006.01)
    *H05K 3/10* (2006.01)
    *H05K 3/30* (2006.01)
    *H05K 3/40* (2006.01)
    *H05K 3/46* (2006.01)
    *H01L 23/29* (2006.01)
    *H01L 23/31* (2006.01)
    *H01L 23/498* (2006.01)
    *H01L 31/02* (2006.01)

(52) U.S. Cl.
    CPC ....... *H05K 1/189* (2013.01); *H05K 2201/032* (2013.01); *H05K 2201/0347* (2013.01); *H05K 2201/10128* (2013.01)

(58) Field of Classification Search
    CPC ............ H05K 3/03; H05K 3/30; H05K 3/305; H05K 3/306; H05K 1/02; H05K 1/03; H05K 1/116; H05K 1/186; H05K 3/10; H05K 3/40; H05K 3/46; H01L 27/14634; H01L 27/14636; H01L 27/1464; H01L 27/1469; H01L 27/14618; H01L 31/02; H01L 23/29; H01L 23/31; H01L 23/498
    USPC ............... 361/749, 748, 760, 761, 782, 634; 174/250, 254, 255, 258, 260; 29/829, 29/832, 837, 846, 852; 257/448, 734, 257/736, 774
    See application file for complete search history.

(56) References Cited

U.S. PATENT DOCUMENTS

| | | | | |
|---|---|---|---|---|
| 7,038,239 B2* | 5/2006 | Murakami | ........ | H01L 29/78606 257/59 |
| 2003/0155247 A1* | 8/2003 | Miura | .................... | C25D 7/123 205/157 |
| 2004/0065960 A1* | 4/2004 | Egitto | ............... | H01L 23/49827 257/774 |
| 2005/0102831 A1* | 5/2005 | Saiki | ...................... | H05K 3/381 29/852 |
| 2005/0103520 A1* | 5/2005 | Saiki | .................... | H05K 3/0035 174/250 |
| 2007/0034519 A1* | 2/2007 | Chinda | .................. | H05K 3/423 205/125 |
| 2007/0145584 A1* | 6/2007 | Kataoka | .................... | C25D 5/02 257/736 |
| 2007/0176613 A1* | 8/2007 | Ogawa | ................. | H05K 1/0274 361/760 |
| 2008/0236872 A1* | 10/2008 | Kataoka | .................. | H05K 3/06 174/254 |
| 2009/0201699 A1* | 8/2009 | Ohno | .................. | H05K 1/0206 362/634 |
| 2010/0170703 A1* | 7/2010 | Iihola | ..................... | H01L 24/82 174/254 |
| 2011/0003167 A1* | 1/2011 | Kitagawa | .................. | C22C 9/02 428/600 |
| 2012/0186861 A1* | 7/2012 | Shimizu | .............. | H01L 23/5389 174/255 |
| 2012/0188734 A1* | 7/2012 | Mikado | ............. | H01L 21/4846 361/761 |
| 2012/0217049 A1* | 8/2012 | Hanai | .................... | H05K 1/185 174/260 |
| 2012/0217607 A1* | 8/2012 | Hanai | ............... | H01L 27/14636 257/448 |
| 2012/0241205 A1* | 9/2012 | Shimizu | ................. | H01L 24/19 174/260 |
| 2012/0287586 A1* | 11/2012 | Mikado | ............ | H01L 23/49822 361/748 |
| 2013/0182401 A1* | 7/2013 | Furutani | ................ | H05K 1/116 361/782 |
| 2013/0194764 A1* | 8/2013 | Mikado | .................. | H05K 1/185 361/761 |
| 2013/0256007 A1* | 10/2013 | Furutani | ................. | H05K 1/185 174/255 |
| 2013/0284506 A1* | 10/2013 | Zanma | ................... | H05K 1/185 174/260 |
| 2016/0322289 A1* | 11/2016 | Kobayashi | ........ | H01L 23/49822 |
| 2017/0064825 A1* | 3/2017 | Ishihara | ................. | H05K 1/113 |
| 2017/0162553 A1* | 6/2017 | Bibl | ............ | G09F 9/00 |
| 2017/0309558 A1* | 10/2017 | Kajihara | ................. | H01L 24/17 |
| 2018/0039360 A1* | 2/2018 | Akimoto | ............. | G06F 3/04164 |
| 2018/0069163 A1* | 3/2018 | Clark | ................. | H01L 21/563 |

\* cited by examiner

[FIG. 1a]
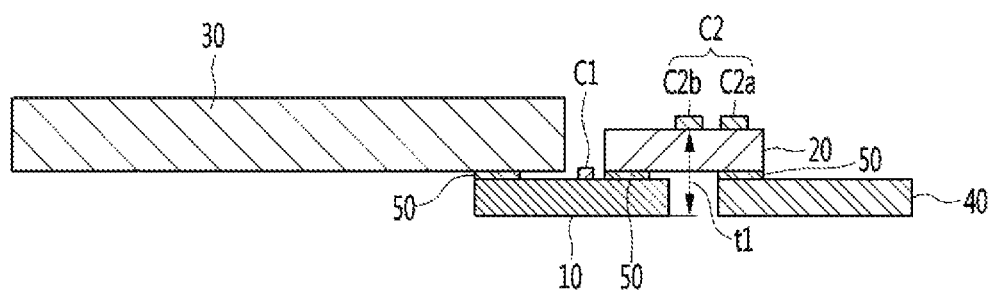
[FIG. 1b]
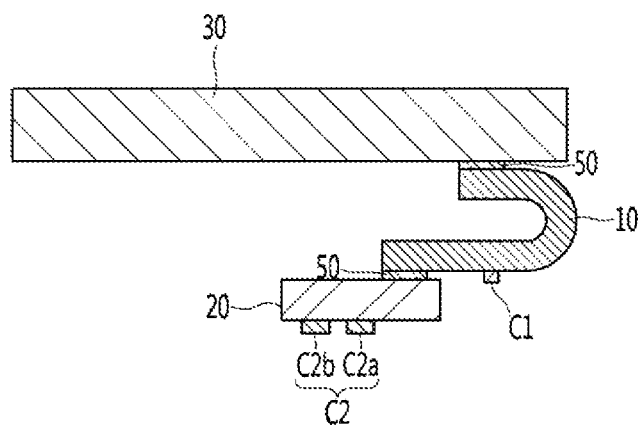

【FIG. 1c】
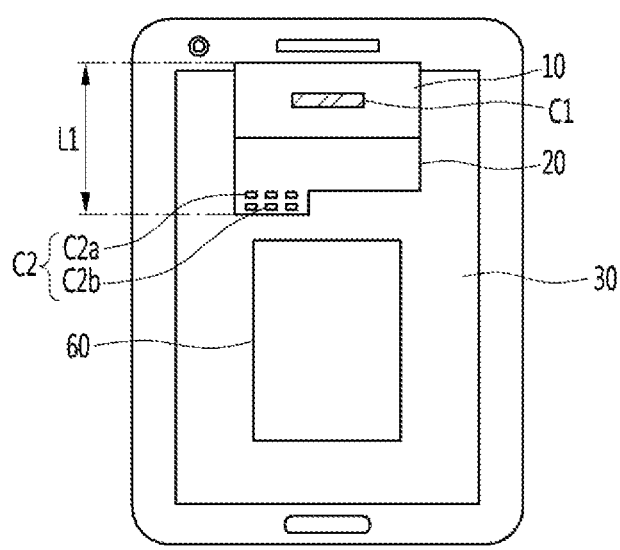
【FIG. 2a】
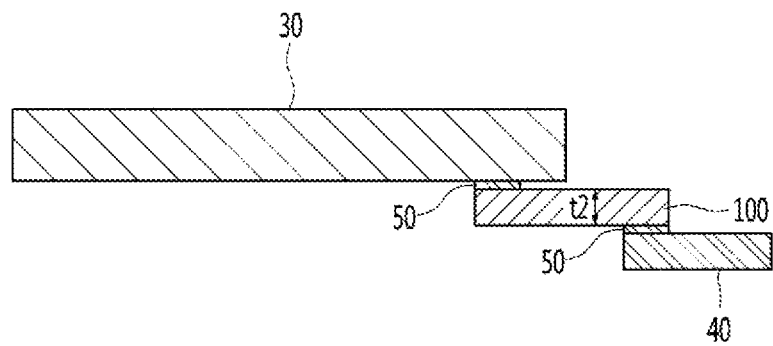

[FIG. 2b]
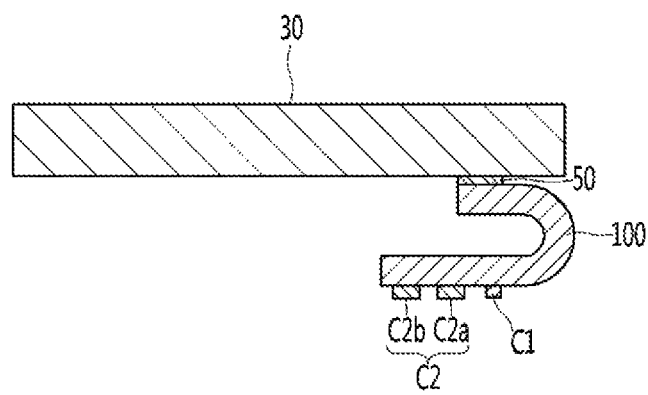
[FIG. 2c]
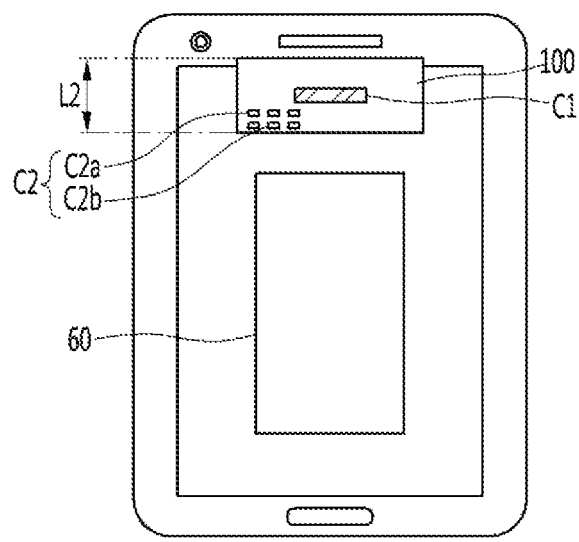

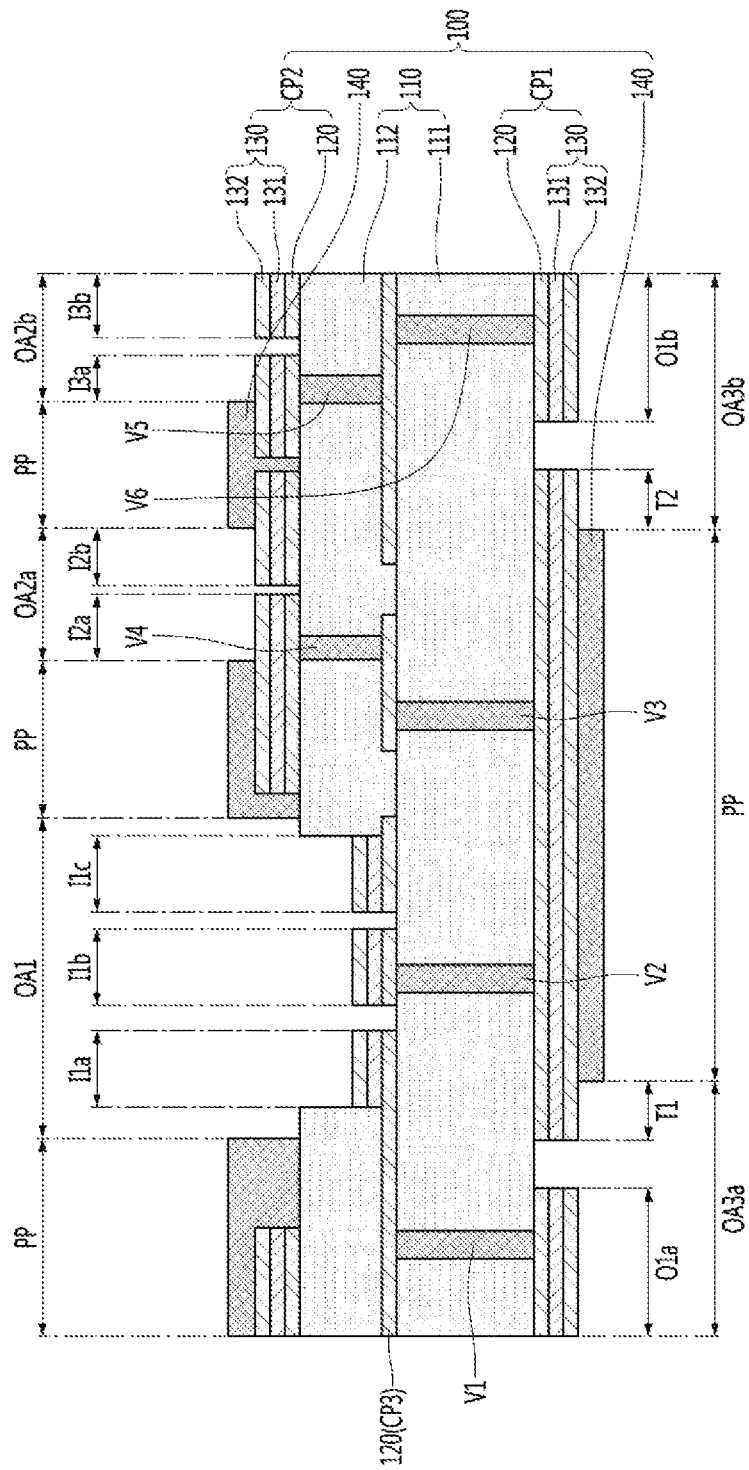
[FIG. 3a]

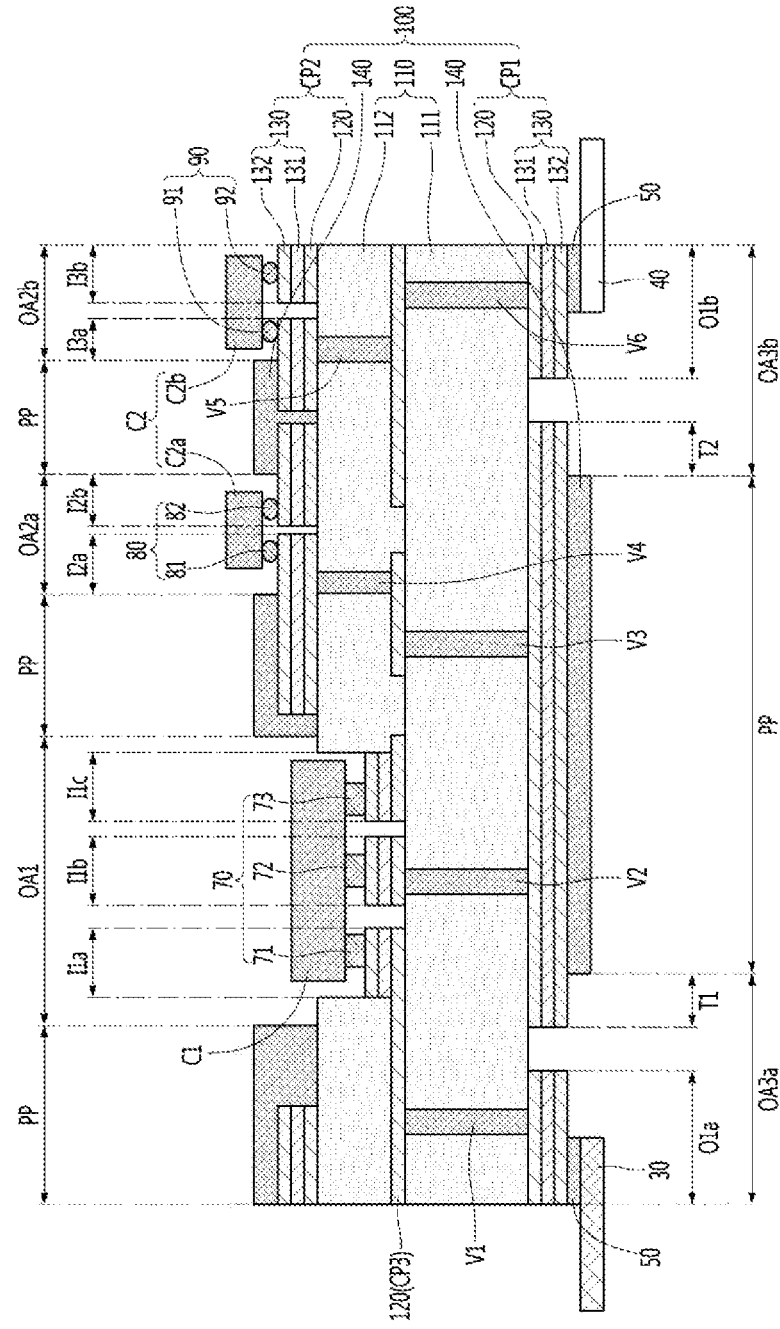
[FIG. 3b]

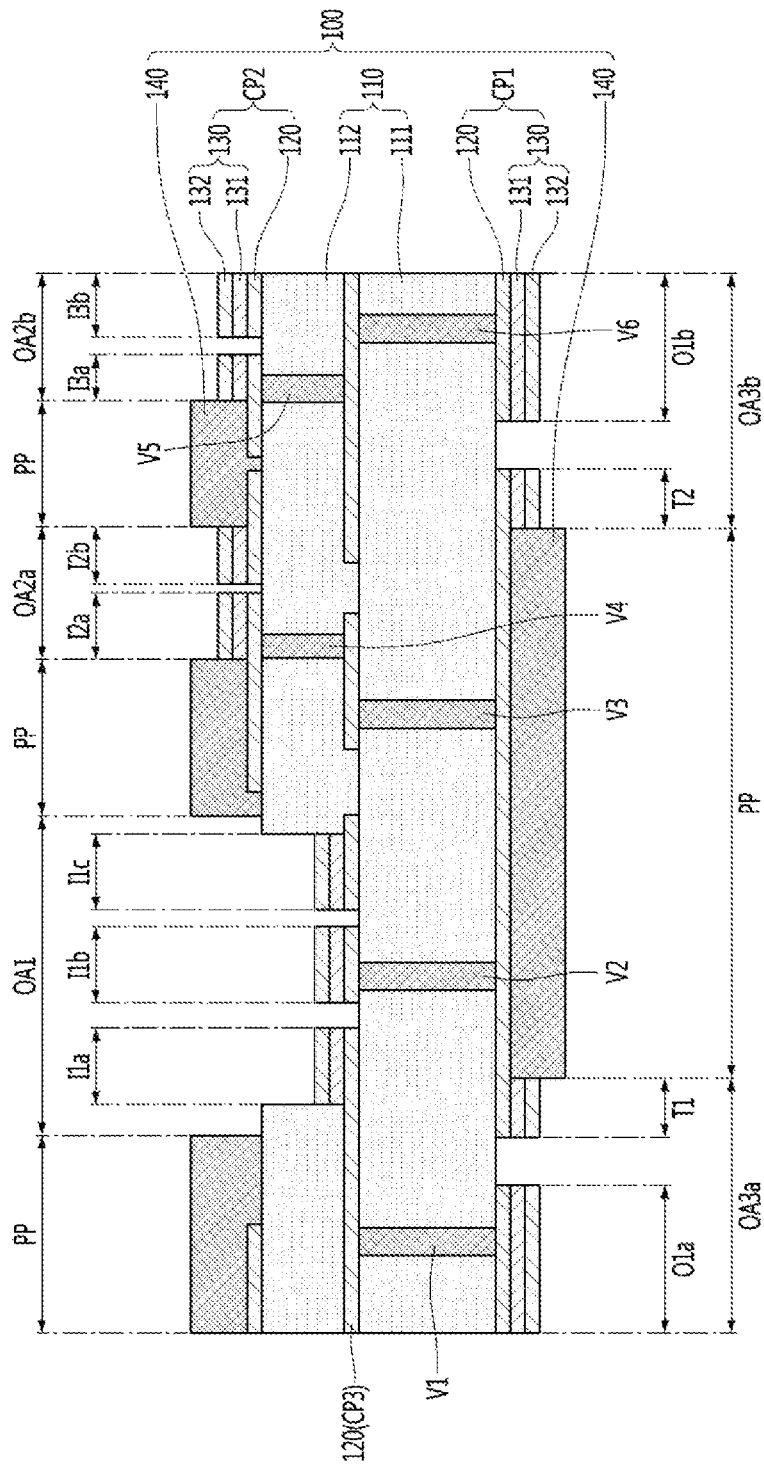
[FIG. 4a]

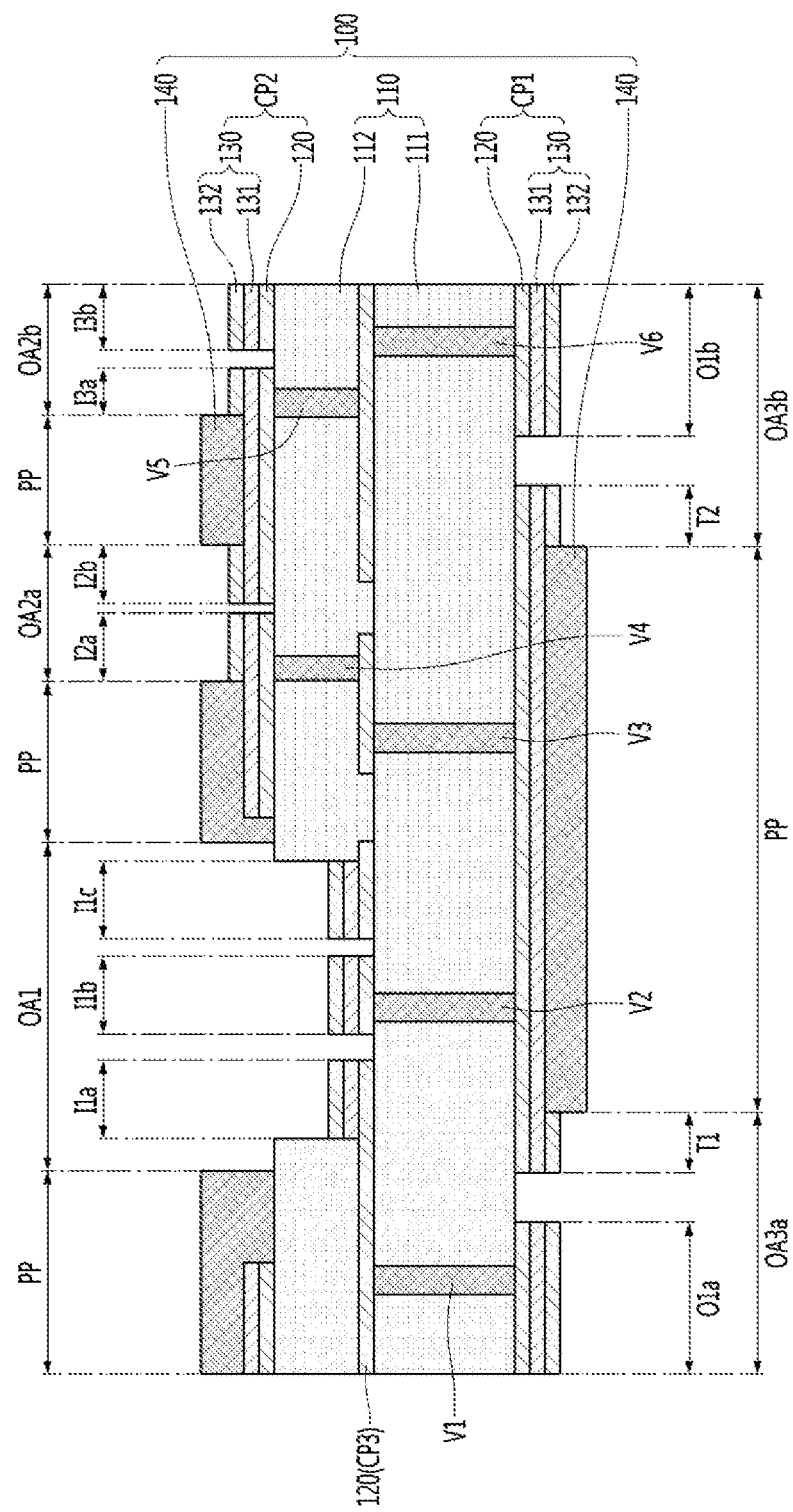
[FIG. 4b]

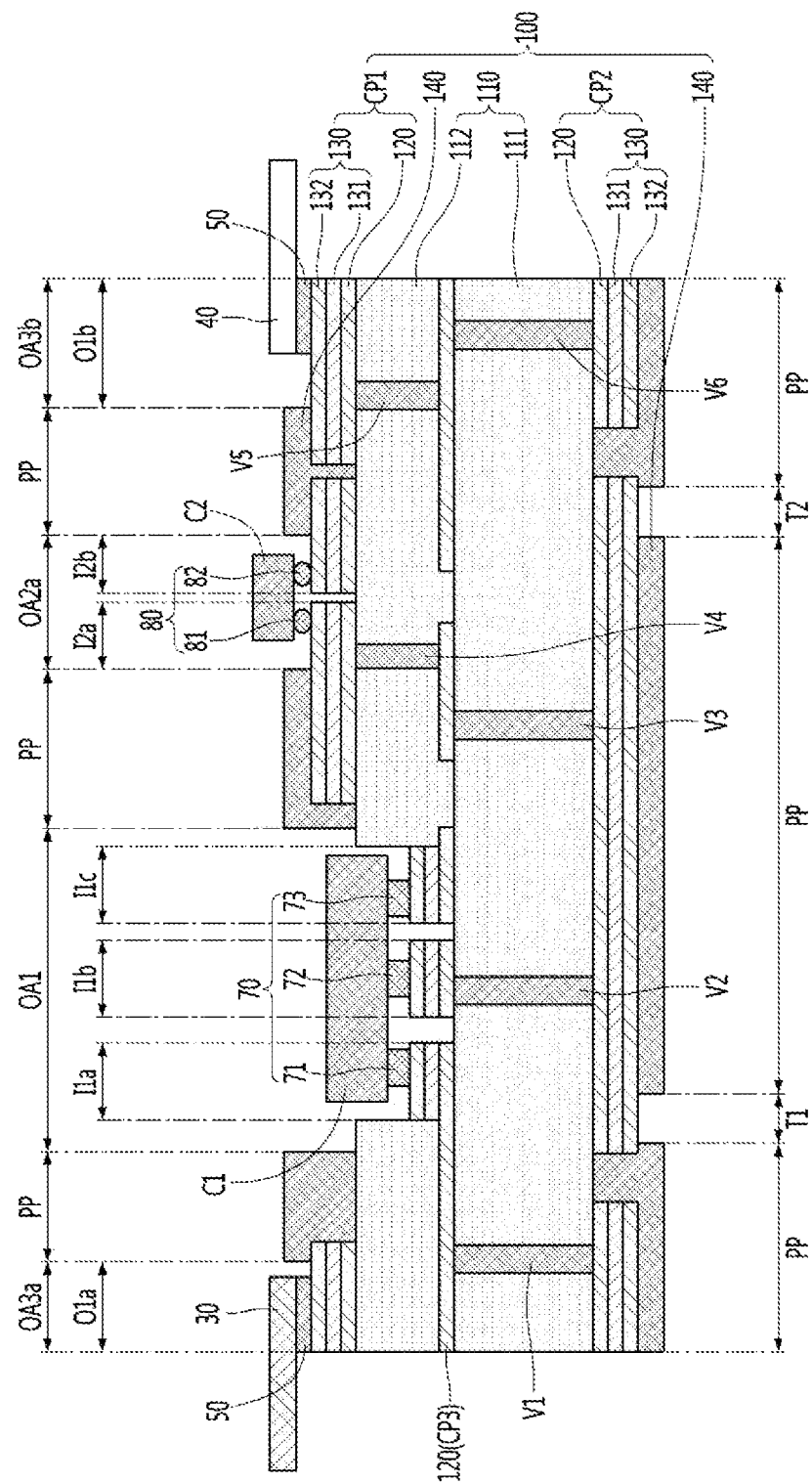
[FIG. 5a]

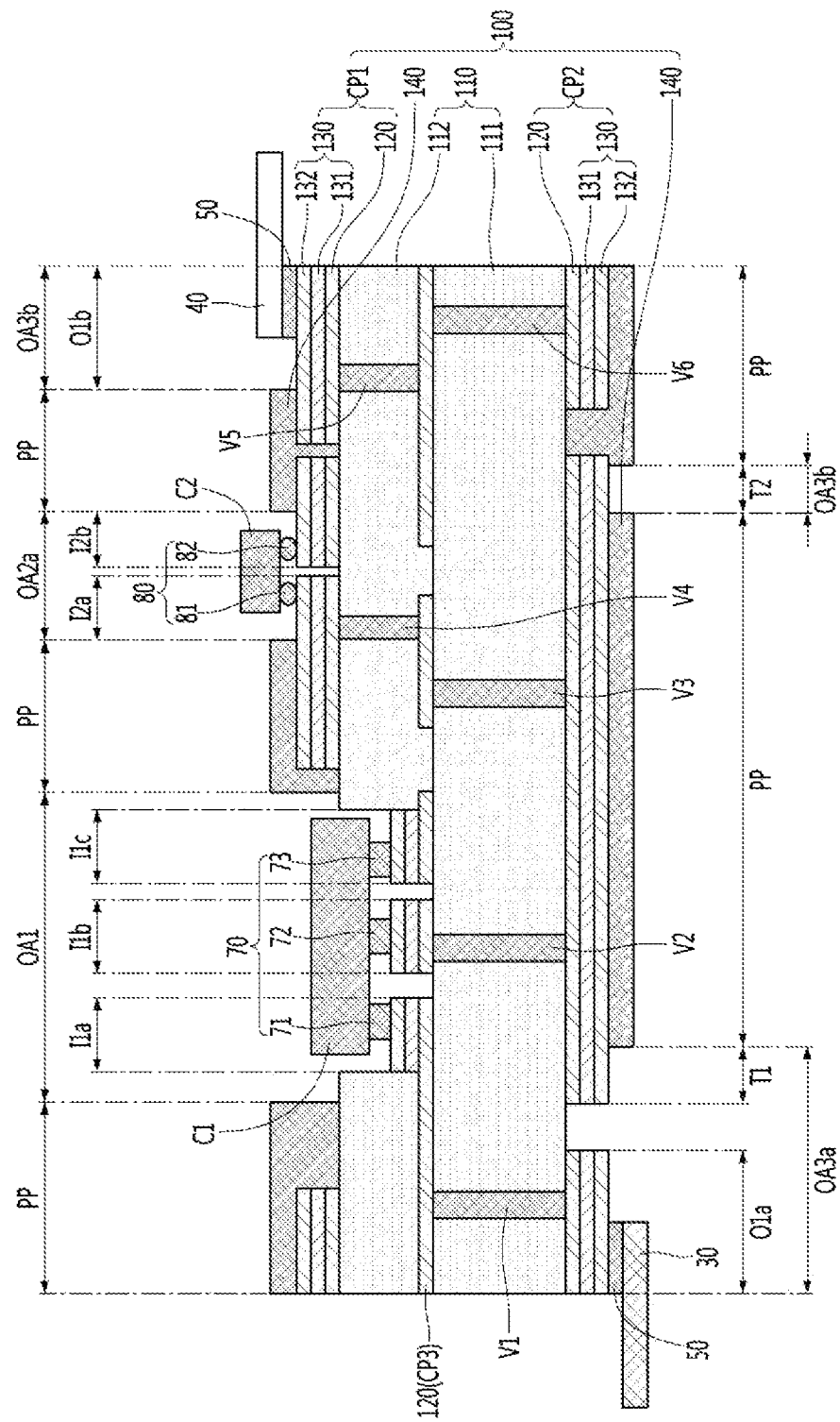
[FIG. 5b]

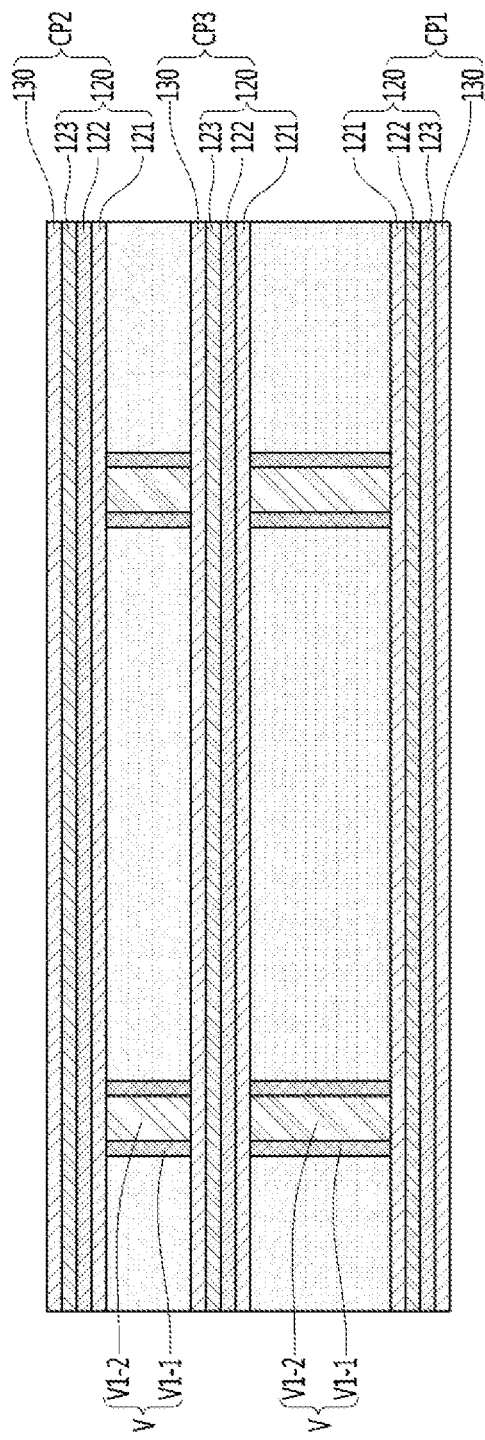
[FIG. 6]

[FIG. 7]
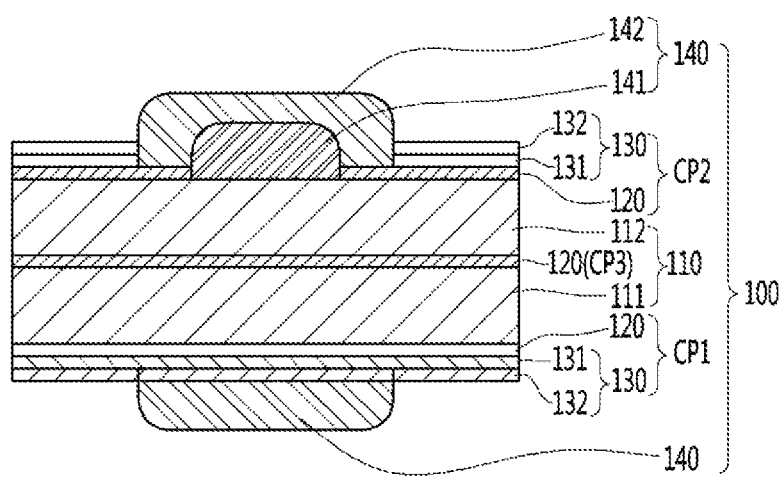

[FIG. 8]
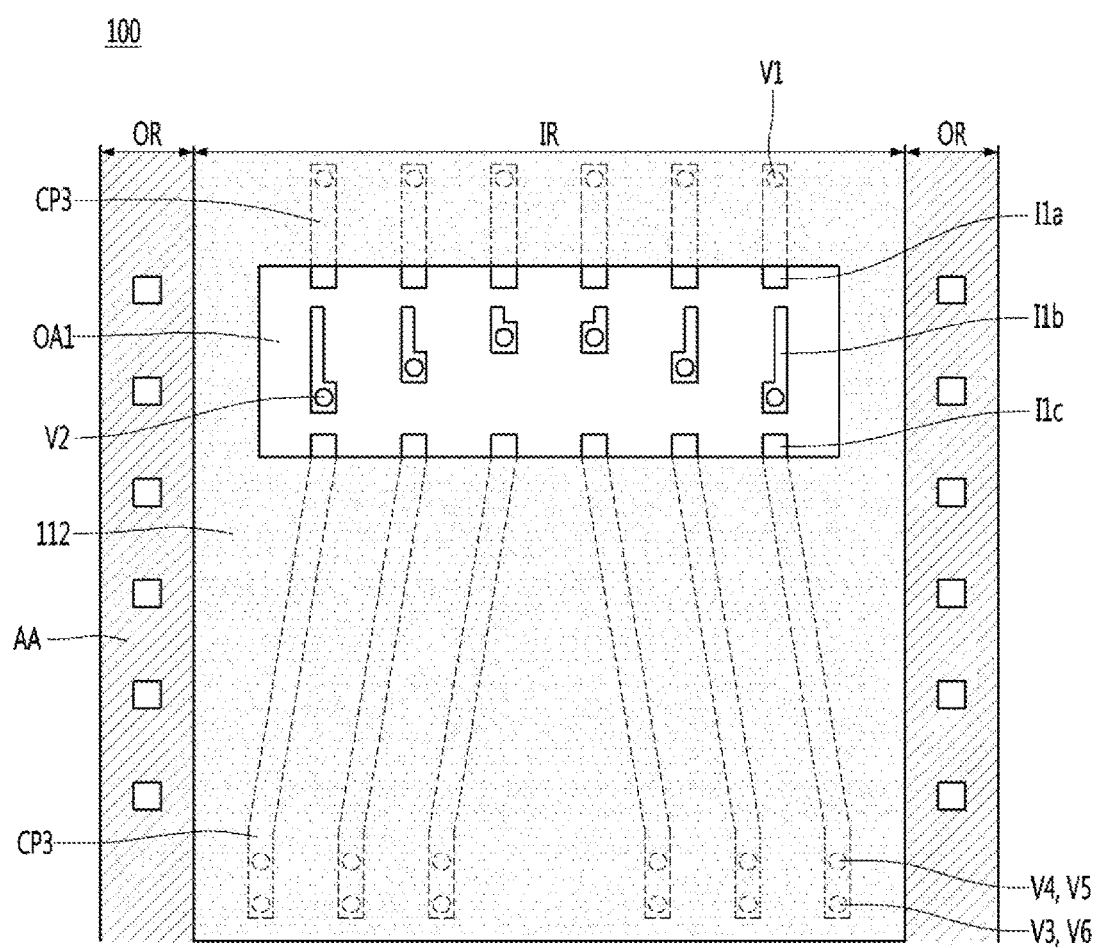

[FIG. 9]
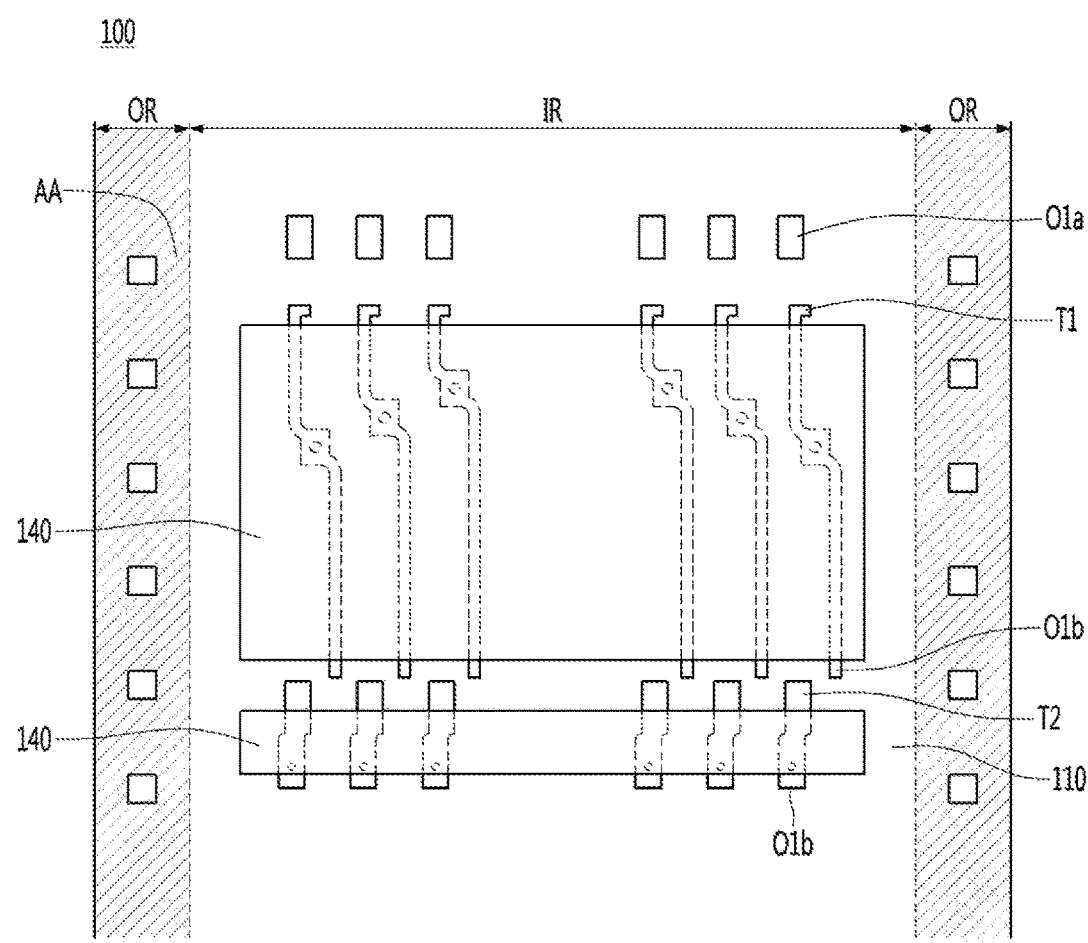

[FIG. 10a]
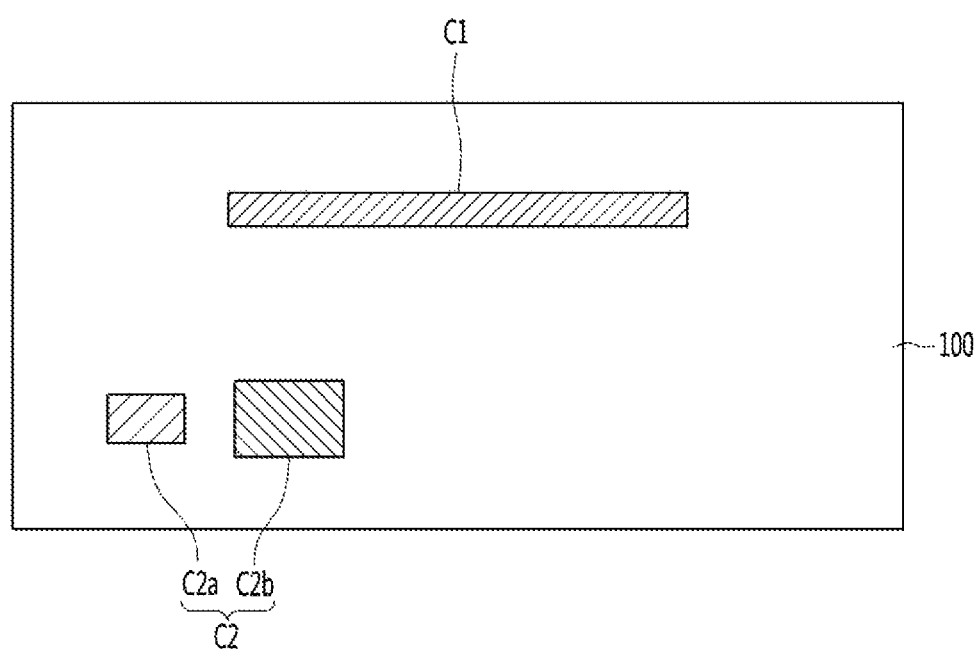

[FIG. 10b]
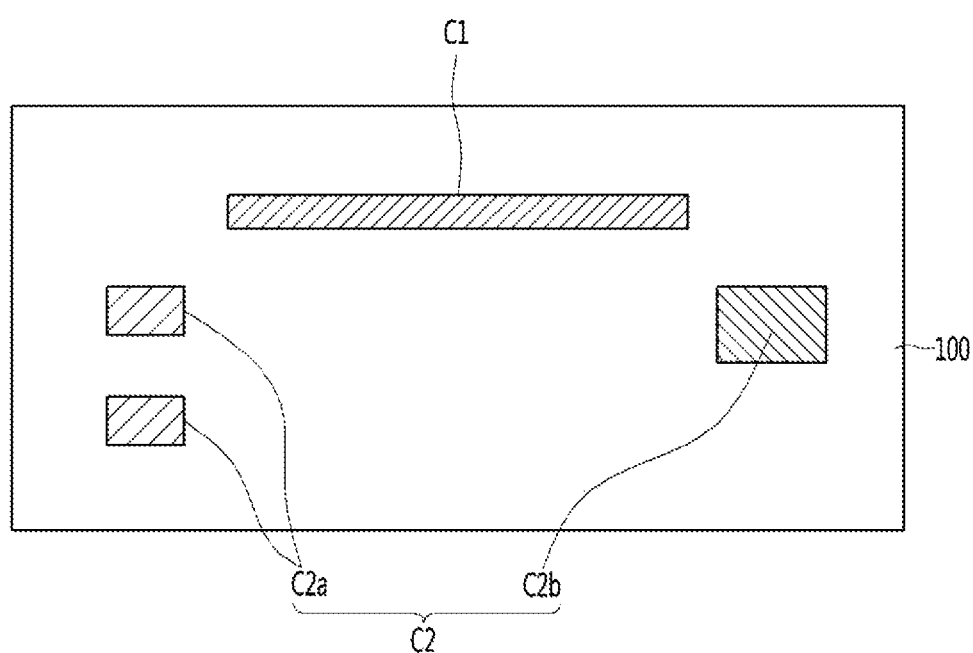

[FIG. 11a]
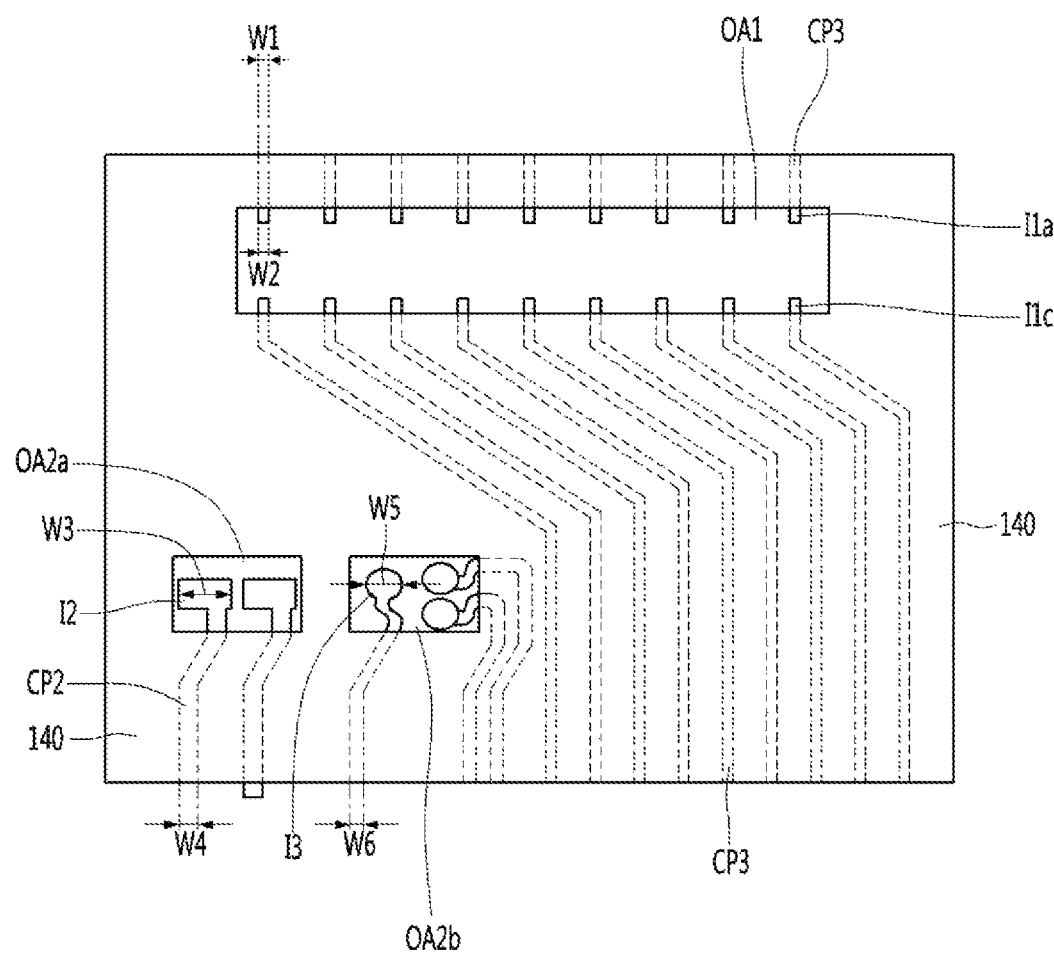

[FIG. 11b]
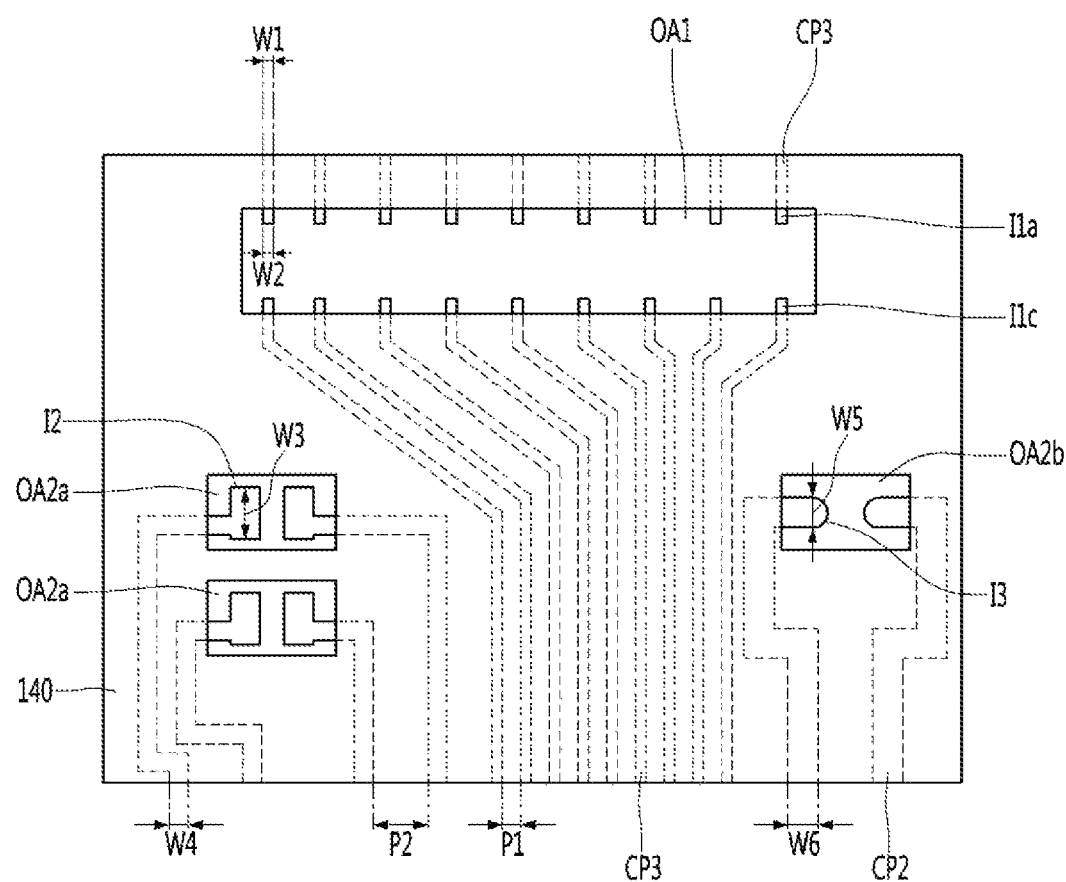

[FIG. 12a]
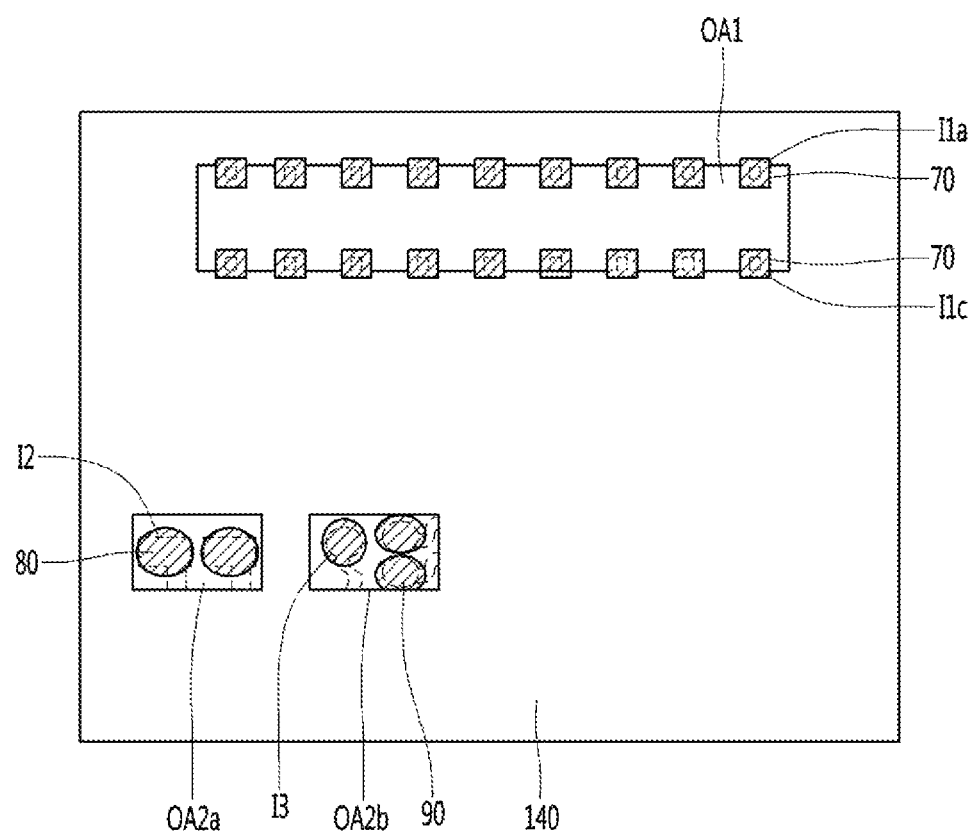

【FIG. 12b】
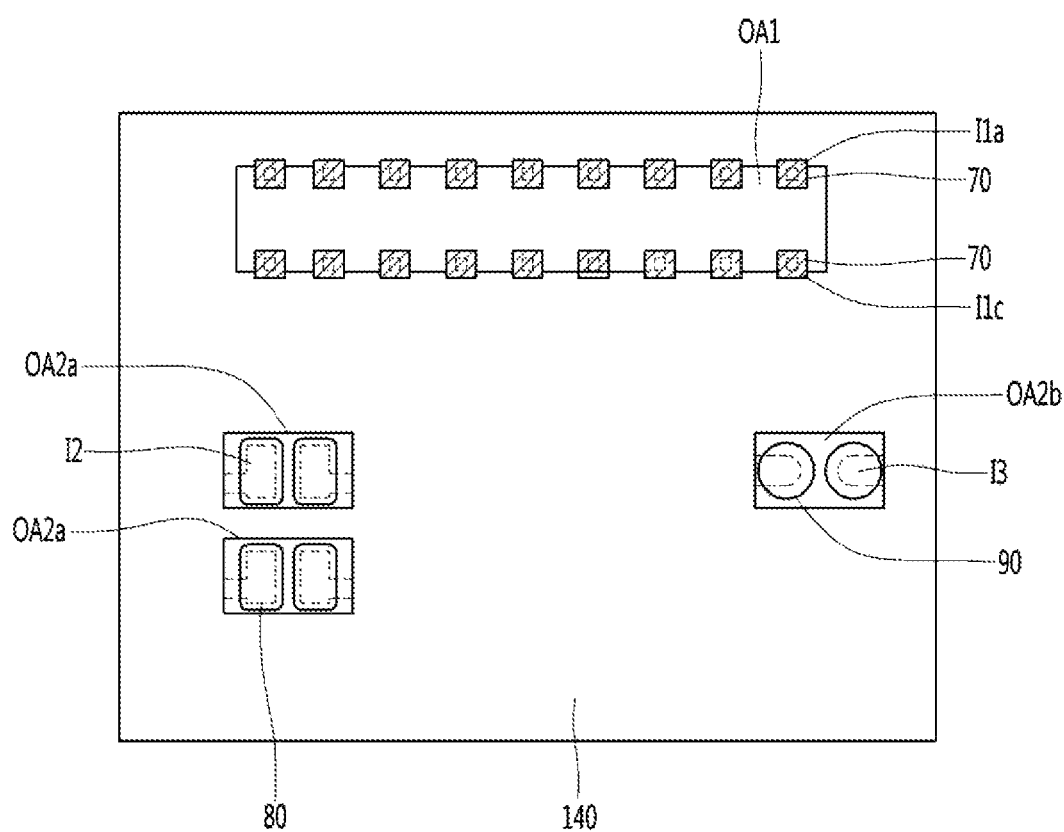

[FIG. 13a]
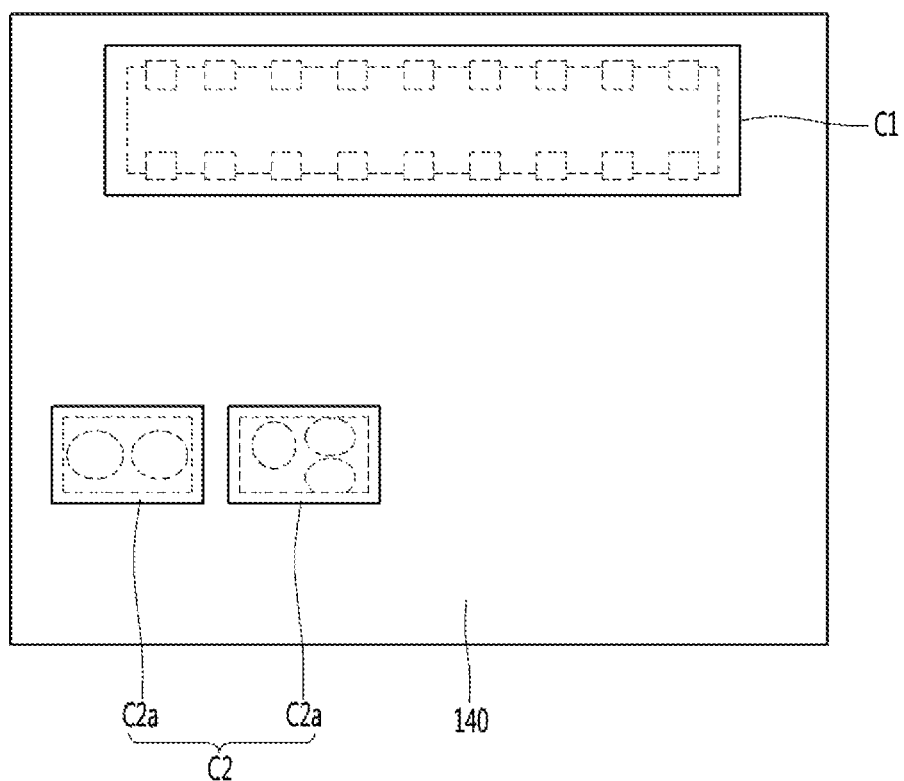

【FIG. 13b】
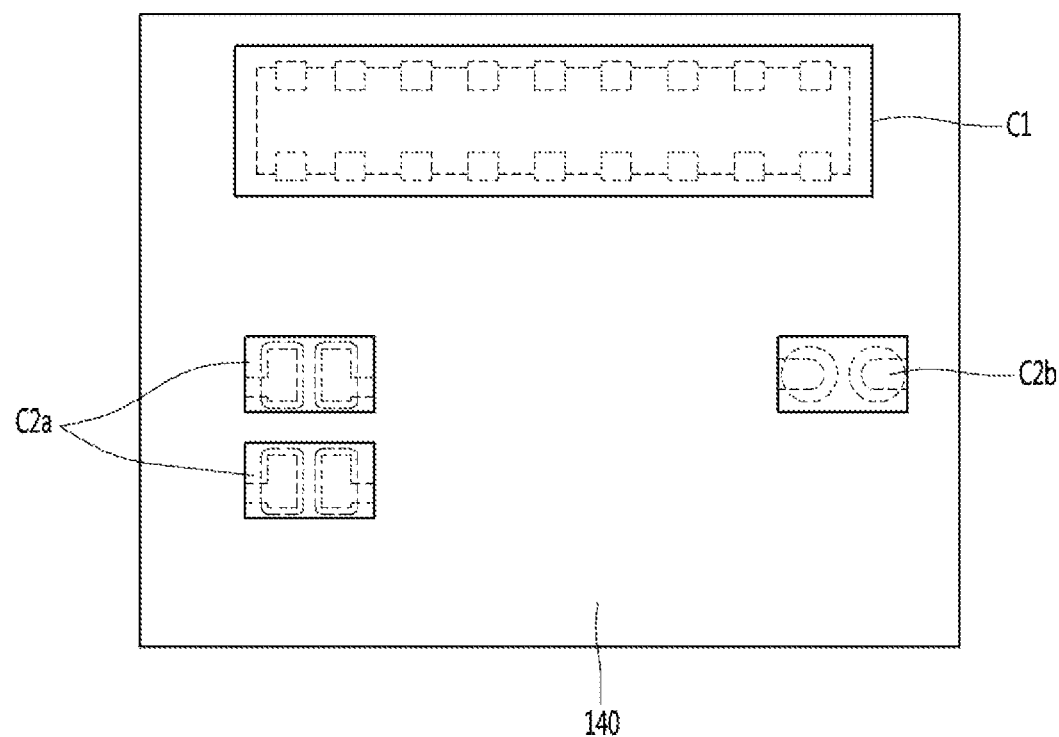

【FIG. 14】
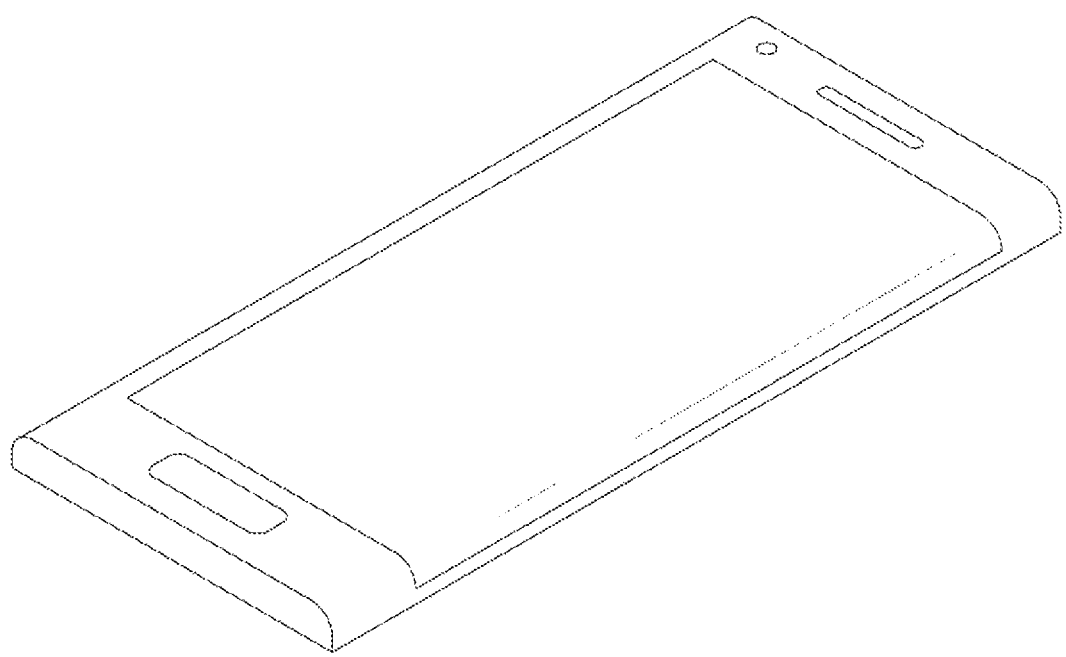

[FIG. 15]
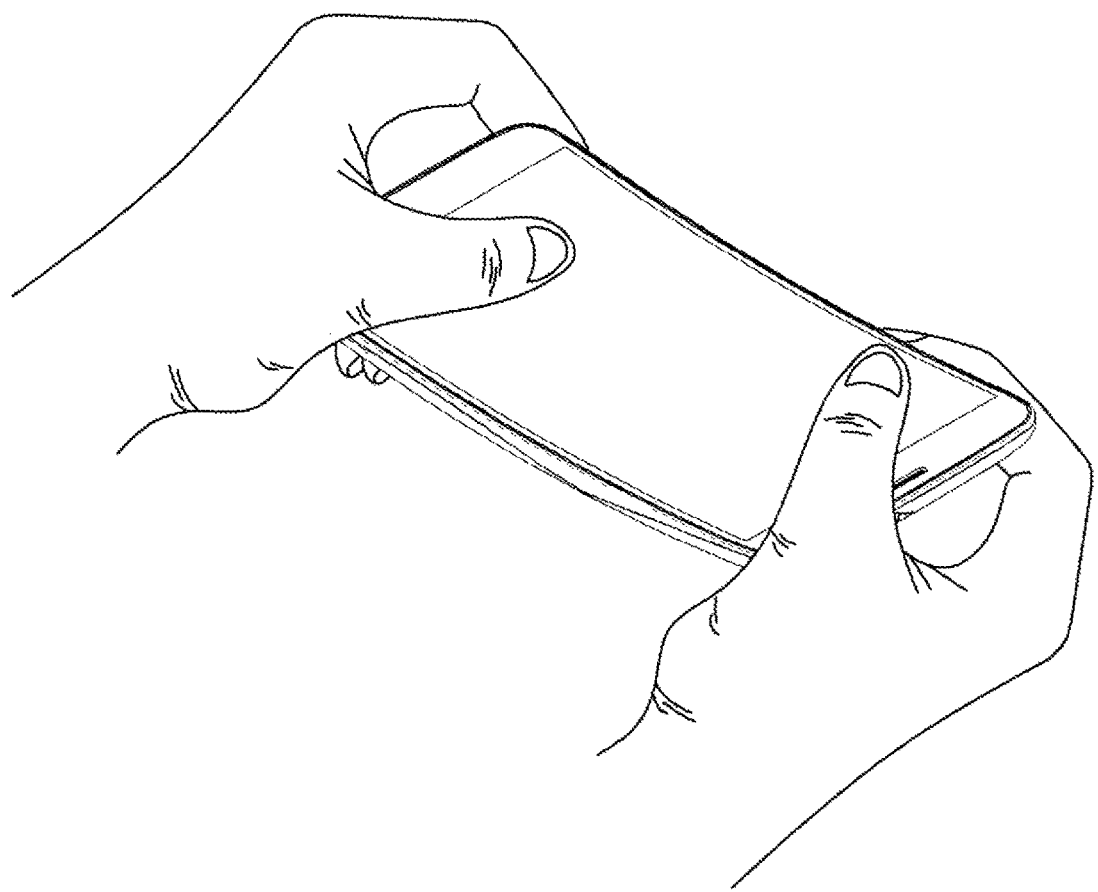

[FIG. 16a]
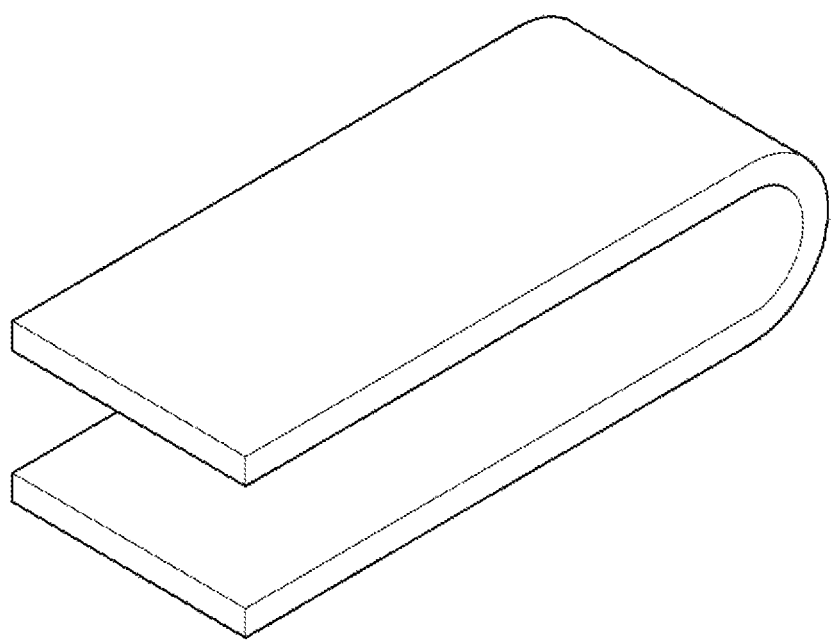

【FIG. 16b】
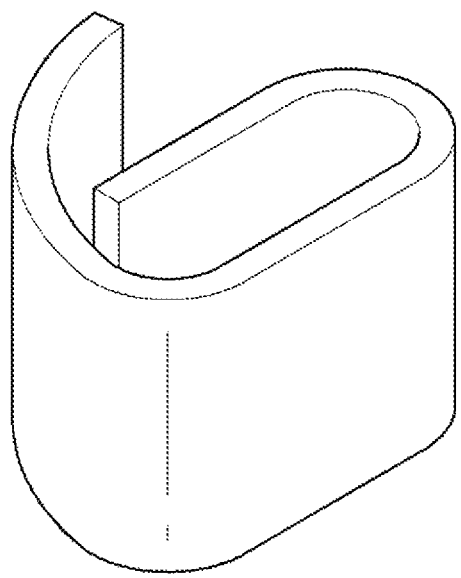

[FIG. 16c]
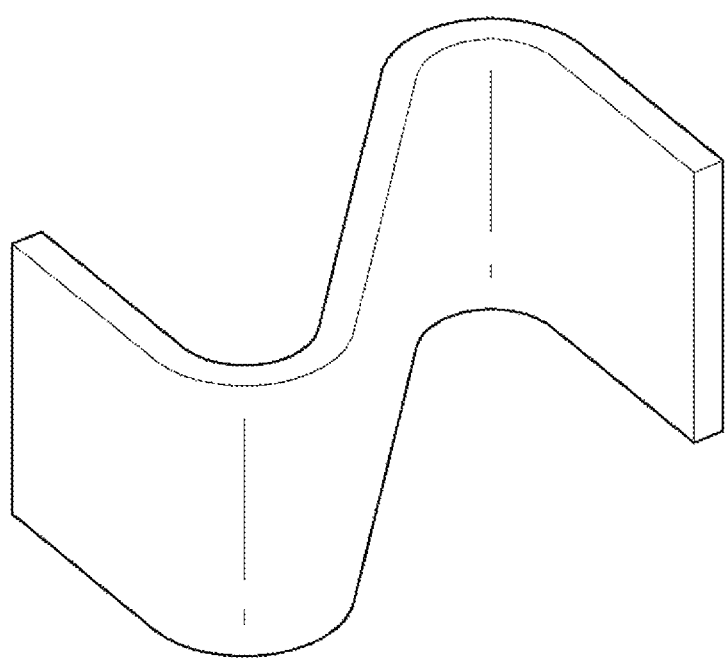

[FIG. 17]
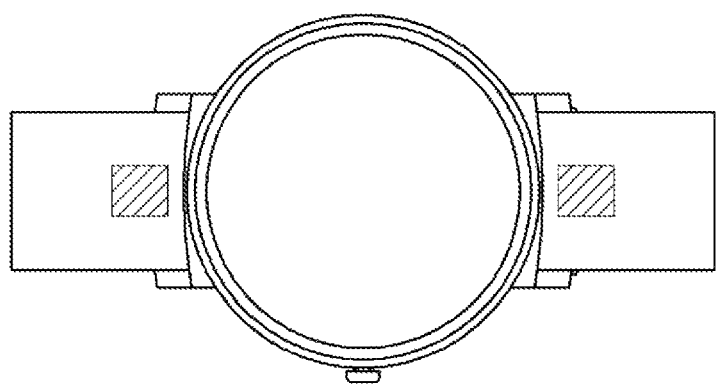

[FIG. 18]
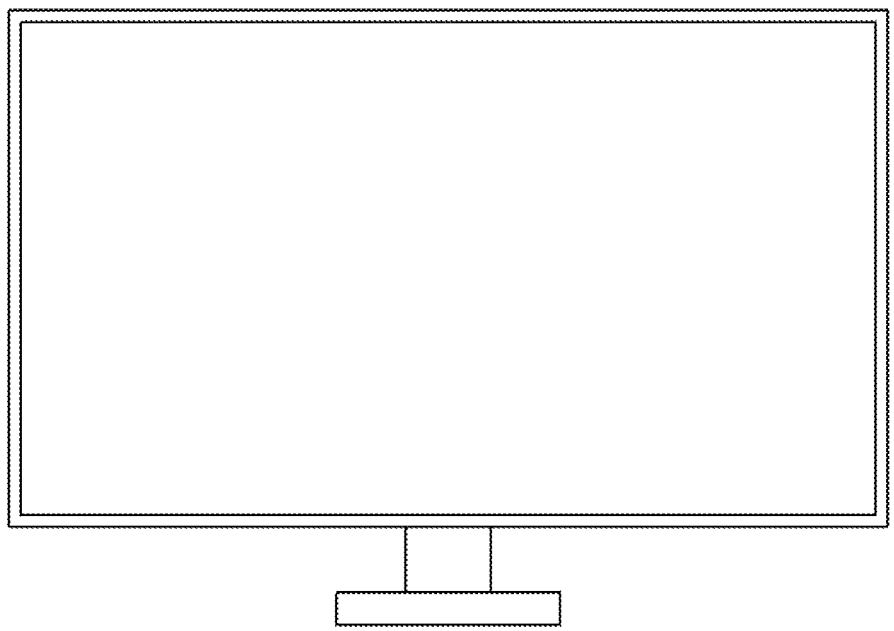

FLEXIBLE CIRCUIT BOARD, CHIP PACKAGE INCLUDING THE SAME, AND ELECTRONIC DEVICE INCLUDING THE CHIP PACKAGE

CROSS-REFERENCE TO RELATED APPLICATION

The present application claims priority under 35 U.S.C. 119 and 35 U.S.C. 365 to Korean Patent Application No. 10-2018-0109253 (filed on Sep. 12, 2018), which is hereby incorporated by reference in its entirety.

BACKGROUND

The embodiment relates to a flexible circuit board, a chip package including the same, and an electronic device including the chip package.

In detail, according to the flexible circuit board, the chip package thereof, and the electronic device including the chip package, different types of chips may be mounted on different layers of one substrate in the flexible circuit board.

Recently, various electronic products have become thin, compact, and lightweight. Accordingly, various studies for mounting a semiconductor chip in a narrow area of an electronic device at a high density have been conducted.

Among mounting schemes, since a chip-on-film (COF) scheme uses a flexible substrate, the COF scheme may be applied to both flat panel displays and flexible displays. In other words, the COF scheme has been spotlighted in that the COF scheme may be applied to various wearable electronic devices. In addition, since the COF scheme may implement a fine pitch, the COF scheme may be used to implement quad high definition (QHD) displays with high resolution due to an increase in the number of pixels.

COF is a scheme of mounting a semiconductor chip on a flexible circuit board which is in the form of a thin film. For example, the semiconductor chip may be an integrated circuit (IC) chip or a large scale integrated circuit (LSI) chip.

However, a COF flexible circuit board cannot be directly connected between a display panel and a main board.

In other words, at least two printed circuit boards are required between the display panel and the main board.

An electronic device having a display unit requires a plurality of printed circuit boards, so that a thickness of the electronic device may be increased. In addition, sizes of the printed circuit boards may be limitation to the miniaturization of the electronic device. In addition, the bonding failure in the printed circuit boards may deteriorate reliability of the electronic device.

Therefore, there is a demand for a novel flexible circuit board that may solve such problems.

SUMMARY

The embodiment provides a flexible circuit board capable of mounting a plurality of chips on one substrate, a chip package including the same, and an electronic device including the chip package.

In addition, the embodiment provides a flexible circuit board capable of mounting a plurality of chips on different layers of one substrate, a chip package including the same, and an electronic device including the chip package.

The technical objects to be achieved by the proposed embodiments are not limited to the above-described technical objects, and other technical objects that have not been described may be clearly understood by those skilled in the art to which the proposed embodiments belong from the following description.

According to an embodiment, a flexible circuit board includes: a first substrate; a second substrate disposed on the first substrate and including an opening; a first conductive pattern part disposed on a bottom surface of the first substrate; a second conductive pattern part disposed on a top surface of the second substrate; a third conductive pattern part disposed between the first substrate and the second substrate; and an upper protective layer partially disposed on the second conductive pattern part and including a first open region, wherein the third conductive pattern part includes: a first inner lead pattern part disposed in the opening of the second substrate; and a first extension pattern part connected to the first inner lead pattern part, the second conductive pattern part includes: a second inner lead pattern part disposed in the first open region of the upper protective layer; and a second extension pattern part connected to the second inner lead pattern part, and a number of first inner lead pattern parts is greater than a number of second inner lead pattern parts.

In addition, a width of the first inner lead pattern part may be smaller than a width of the second inner lead pattern part.

In addition, a width of the first extension pattern part may be smaller than a width of the second extension pattern part.

In addition, a pitch between the first inner lead pattern parts may be smaller than a pitch between the second inner lead pattern parts.

In addition, a pitch between first extension pattern parts may be smaller than a pitch between second extension pattern parts.

In addition, at least one of the first to third conductive pattern parts may include: a conductive pattern layer; and a plating layer disposed on the conductive pattern layer and including tin.

In addition, the conductive pattern layer of at least one of the first to third conductive pattern parts may include: a first conductive pattern including nickel and chromium; a second conductive pattern disposed on the first conductive pattern and including copper; and a third conductive pattern disposed on the second conductive pattern and including copper.

In addition, the flexible circuit board may further include: at least one first via passing through the first substrate and connecting the first conductive pattern to the third conductive pattern; and at least one second via passing through the second substrate and connecting the second conductive pattern and the third conductive pattern, wherein each of the first and second vias may include: a first via layer disposed on an inner wall of a via hole which is formed through the first substrate or the second substrate, and including palladium; and a second via layer disposed in the first via layer to fill the via hole, and including copper.

In addition, a thickness of the first substrate may be thicker than a thickness of the second substrate.

In addition, the flexible circuit board may further include a lower protective layer partially disposed under the first conductive pattern part and including a third open region, wherein the first conductive pattern part may include first and second outer lead pattern parts exposed through the third open region.

In addition, the second conductive pattern part may further include a third inner lead pattern part exposed through a second open region of the upper protective layer, and a total number of the second and third inner lead pattern parts may be smaller than the number of the first inner lead pattern parts.

Meanwhile, according to an embodiment, a chip package includes a flexible circuit board, wherein the flexible circuit board includes: a first substrate; a second substrate disposed on the first substrate and including an opening; a first conductive pattern part disposed on a bottom surface of the first substrate; a second conductive pattern part disposed on a top surface of the second substrate; a third conductive pattern part disposed between the first substrate and the second substrate; and an upper protective layer partially disposed on the second conductive pattern part and including a first open region, the third conductive pattern part includes: a first inner lead pattern part disposed in the opening of the second substrate; and a first extension pattern part connected to the first inner lead pattern part, the second conductive pattern part includes: at least one second inner lead pattern part disposed in the first open region of the upper protective layer; and a second extension pattern part connected to the second inner lead pattern part, a first connection part and a first chip are disposed on the first inner lead pattern part, a second connection part and a second chip are disposed on the second inner lead pattern part, and a number of terminals included in the first chip is greater than a number of terminals included in the second chip.

In addition, the first chip may include a drive IC chip, and the second chip may include at least one of a diode chip, a power supply IC chip, a touch sensor IC chip, an MLCC chip, a BGA chip, and a chip capacitor.

In addition, the second conductive pattern part may further include a third inner lead pattern part exposed through a second open region of the upper protective layer, a third connection part and a third chip may be disposed on the third inner lead pattern part, and a total number of terminals included in the second and third chips may be smaller than the number of terminals included in the first chip.

In addition, according to an embodiment, an electronic device includes: a flexible circuit board including: a first substrate; a second substrate disposed on the first substrate and including an opening; a first conductive pattern part disposed on a bottom surface of the first substrate; a second conductive pattern part disposed on a top surface of the second substrate; a third conductive pattern part disposed between the first substrate and the second substrate; an upper protective layer partially disposed on the second conductive pattern part and including first and second open regions; and a lower protective layer partially disposed under the first conductive pattern part and including a third open region, wherein the third conductive pattern part includes: a first inner lead pattern part disposed in the opening of the second substrate; and a first extension pattern part connected to the first inner lead pattern part, the second conductive pattern part includes: a second inner lead pattern part disposed in the first open region of the upper protective layer; a third inner lead pattern part disposed on the second open region of the upper protective layer; and a second extension pattern part connected to at least one of the second and third inner lead pattern parts, the first conductive pattern part includes first and second outer lead pattern parts exposed through the third open region, and a number of first inner lead pattern parts is greater than a number of second inner lead pattern parts; a display panel connected to the first outer lead pattern part; and a main board connected to the second outer lead pattern part.

According to an embodiment, a flexible circuit board includes: a first substrate; a second substrate disposed on the first substrate; a first conductive pattern part disposed on a bottom surface of the first substrate; a second conductive pattern part disposed on a top surface of the second substrate; and a third conductive pattern part disposed between the first substrate and the second substrate. Each of the first to third conductive pattern parts may include a wiring pattern layer; a first plating layer; and a second plating layer. In addition, a protective layer may be formed in one region of each of the first and second conductive pattern parts to form a protective part, and the protective part may not be disposed in regions other than the one region. A plurality of regions where the protective part is not disposed may be a first open region and a second open region. In other words, the first open region may be formed on the first substrate, and the second open region may be formed on the second substrate. The tin (Sn) content of the second plating layer in the first open region may be different from the tin (Sn) content of the second plating layer in the second open region.

A first connection part may be disposed on the first open region, and a first chip may be disposed on the first connection part. The first connection part may electrically connect the second conductive pattern part to the first chip.

The second connection part may be disposed on the second open region, and the second chip may be disposed on the second connection part. The second connection part may electrically connect the second conductive pattern part to the second chip. In other words, in the present invention, the second substrate exposes the first open region in which the first chip is disposed from an upper region of the first substrate. In addition, the second open region where the protective part is not disposed may be formed on the second substrate.

In addition, a number of terminals included in the first chip may be greater than a number of terminals included in the second chip. In other words, the first chip having a large number of terminals may be disposed on the first open region, and the second chip having a smaller number of terminals as compared with the first chip may be disposed on the second open region.

Accordingly, the embodiment may provide a flexible circuit board chip package in which different types of the first and second chips are mounted on a single flexible circuit board, so that reliability can be improved.

In addition, according to another embodiment, a flexible circuit board may directly connect a display panel to a main board. Accordingly, a size and a thickness of the flexible circuit board that allow a signal generated from the display panel to be transmitted to the main board can be reduced.

In addition, in the flexible circuit board according to the embodiment, it is possible to efficiently form a via within the first substrate, and a via within the second substrate. In other words, in the flexible circuit board according to the embodiment, a number of the vias can be reduced to about ½ as compared with a case where the first chip is disposed on the second substrate.

Accordingly, in the flexible circuit board, the chip package including the same, and the electronic device including the chip package according to the embodiment, a space for other components and/or a battery space can be expanded. In addition, since connection of a plurality of printed circuit boards is not required, a convenience of a process and reliability of electrical connection may be improved.

Accordingly, the flexible circuit board, the chip package including the same, and the electronic device including the chip package according to the embodiment may be suitable for an electronic device having a high-resolution display unit.

BRIEF DESCRIPTION OF THE DRAWINGS

FIG. 1a is a sectional view showing an electronic device having a display unit including a conventional printed circuit board.

FIG. 1b is a sectional view showing a state in which the printed circuit board of FIG. 1a is bent.

FIG. 1c is a plan view showing a state in which the printed circuit board of FIG. 1a is bent.

FIG. 2a is a sectional view showing an electronic device having a display unit including a flexible circuit board according to an embodiment.

FIG. 2b is a sectional view showing a state in which the flexible circuit board of FIG. 2a is bent.

FIG. 2c is a plan view showing a state in which the flexible circuit board of FIG. 2a is bent.

FIG. 3a is a sectional view showing a multilayer flexible circuit board according to another embodiment.

FIG. 3b is a sectional view showing a chip package including the multilayer flexible circuit board of FIG. 3a.

FIG. 4a is a sectional view showing a multilayer flexible circuit board according to still another embodiment.

FIG. 4b is a sectional view showing the multilayer flexible circuit board according to still another embodiment.

FIG. 5a is a sectional view showing a chip package including a multilayer flexible circuit board according to yet another embodiment.

FIG. 5b is a sectional view showing the chip package including the multilayer flexible circuit board according to yet another embodiment.

FIG. 6 is a view showing the detailed configuration of a conductive pattern part and a via included in the multilayer flexible circuit board of FIG. 3a.

FIG. 7 is an enlarged sectional view showing one region of the multilayer flexible circuit board according to the embodiment.

FIG. 8 is a plan view showing a first substrate included in the multilayer flexible circuit board of FIG. 3a.

FIG. 9 is a bottom view showing the first substrate included in the multilayer flexible circuit board of FIG. 3a.

FIGS. 10a and 10b illustrate the multilayer flexible printed circuit board 100 embodying C1 and C2 arranged on different surfaces of a plurality of substrates.

FIGS. 11a to 13b are views showing a process of manufacturing the chip package including the multilayer flexible circuit board of FIG. 3b by using the multilayer flexible circuit board of FIG. 3a.

FIGS. 14 to 18 are views showing various electronic devices including the flexible circuit board.

DETAILED DESCRIPTION OF THE EMBODIMENTS

Hereinafter, preferred embodiments of the invention will be described in detail with reference to the accompanying drawings.

However, the technical idea of the present invention is not limited to some embodiments which will described below, but may be implemented in various other forms, and one or more of components of the embodiments may be selectively combined and substituted for use within the scope of the technical idea of the present invention.

In addition, unless specifically defined and described explicitly, the terms (including technical and scientific terms) used in the embodiments of the present invention may be interpreted in a meaning that may be generally understood by those having ordinary skill in the art to which the present invention pertains, and meanings of terms that are commonly used such as terms defined in a dictionary may be interpreted in consideration of the contextual meaning of the relevant technology. Further, the terms used in the embodiments of the present invention are for explaining the embodiments, and are not intended to limit the present invention.

In this specification, singular forms may also include plural forms unless specifically stated otherwise in a phrase, and when it is described as "at least one (or one or more) of A, B, and C", it may include one or more of all combinations that may be combined with A, B, and C. In addition, in describing the components of the embodiments of the present invention, terms such as first, second, A, B, (a), and (b) can be used.

Such terms are only for distinguishing one component from another component, and nature, a sequence, an order, or the like of the corresponding component are not limited by the terms. In addition, when it is described that one component is "connected", "coupled", or "joined" to the other component, it shall be construed as not only being directly connected, coupled, or joined to the other component, but also as being "connected", "coupled", or "joined" by another component between the one component and the other component.

In addition, when it is described as being formed or disposed "on (over)" or "under (below)" of each component, it shall be construed as a case where two components are in direct contact with each other, as well as a case where one or more other components are formed or disposed between the two components. In addition, when it is expressed as "on (over)" or "under (below)", it may refer to a downward direction as well as an upward direction with respect to one component.

Referring to FIGS. 1a to 1c, a printed circuit board according to a comparative example will be described.

An electronic device including a display unit requires at least two printed circuit boards to transmit a signal of a display panel to a main board.

At least two printed circuit boards may be included in the electronic device including the display unit according to the comparative example.

The electronic device including the display unit according to the comparative example may include a first printed circuit board 10 and a second printed circuit board 20.

The first printed circuit board 10 may be a flexible printed circuit board (FPCB). In detail, the first printed circuit board 10 may be a chip-on-film (COF) flexible printed circuit board. The first printed circuit board 10 may be a COF flexible printed circuit board on which a first chip C1 is mounted. In more detail, the first printed circuit board 10 may be a COF flexible printed circuit board for arranging a drive IC chip.

The second printed circuit board 20 may be a flexible printed circuit board. In detail, the second printed circuit board 20 may be a flexible printed circuit board for arranging a second chips C2 having a type different from a type of the first chip C1. In this case, the second chip C2 may be a chip other than the drive IC chip, and may refer to various chips arranged on a flexible printed circuit board for electrical connection, such as a chip, a semiconductor device, and a socket other than the drive IC chip. The second printed circuit board 20 may be a flexible printed circuit board for arranging a plurality of second chips C2. For example, the second printed circuit board 20 may be a flexible printed circuit board for arranging different types of a plurality of second chips C2a and C2b.

Since the second printed circuit board 20 is provided as a flexible printed circuit board, the second printed circuit board 20 may be thicker than the first printed circuit board 10 that is a COF flexible printed circuit board.

The first printed circuit board 10 and the second printed circuit board 20 may have mutually different thicknesses. The thickness of the second printed circuit board 20 may be greater than the thickness of the first printed circuit board 10. For example, the first printed circuit board 10 may have a thickness of about 20 µm to 100 µm. The second printed circuit board 20 may have a thickness of about 100 µm to 200 µm. For example, a total thickness t1 of the first printed circuit board 10 and the second printed circuit board may be 200 µm to 250 µm.

In the electronic device having the display unit according to the comparative example, since the first and second printed circuit boards are required between the display panel and the main board, an overall thickness of the electronic device may be increased. In detail, since the electronic device having the display unit according to the comparative example requires the first and second printed circuit boards that are vertically stacked, the overall thickness of the electronic device may be increased.

The first printed circuit board 10 and the second printed circuit board 20 may be formed by different processes. For example, the first printed circuit board 10 may be manufactured by a roll-to-roll process. The second printed circuit board 20 may be manufactured by a sheet scheme.

The first printed circuit board 10 and the second printed circuit board 20 may be provided with different types of chips, and pitches between conductive pattern parts for connecting the respective chips may be different from each other. For example, a pitch of a conductive pattern part disposed on the second printed circuit board 20 may be greater than a pitch of a conductive pattern part disposed on the first printed circuit board 10. For example, the pitch of the conductive pattern part disposed on the second printed circuit board 20 may be 100 µm or more, and the pitch of the conductive pattern part disposed on the first printed circuit board 10 may be less than 100 µm.

In detail, when manufacturing the first printed circuit board 10 having the conductive pattern parts arranged at fine pitches through the roll-to-roll process, process efficiency may be improved, and a process cost may be reduced. Meanwhile, since it is difficult to treat the second printed circuit board 20 having the conductive pattern parts arranged at a pitch of 100 µm or more in the roll-to-roll process, the sheet process has been generally used.

Since the first and second printed circuit boards according to the comparative example are formed by mutually different processes, the process efficiency may be reduced.

In addition, in a chip package including the flexible circuit board according to the comparative example, since there is difficulty in arranging different types of chips on one substrate, separate first and second printed circuit boards are required.

In addition, in the chip package including the flexible circuit board according to the comparative example, it is difficult to connect different types of chips on one substrate.

In other words, conventionally, the first and second printed circuit boards may be disposed between the display panel and the main board.

In order to control, process, or transmit R, G, B signals generated from a display panel 30, the first printed circuit board 10 may be connected to the display panel 30, the first printed circuit board 10 may be connected to the second printed circuit board 20, and the second printed circuit board 20 may be connected to a main board 40.

One end of the first printed circuit board 10 may be connected to the display panel 30. The display panel 30 may be connected to the first printed circuit board 10 through an adhesive layer 50.

The other end opposite to the one end of the first printed circuit board 10 may be connected to the second printed circuit board 20. The first printed circuit board 10 may be connected to the second printed circuit board 20 by the adhesive layer 50.

The one end of the second printed circuit board 20 may be connected to the first printed circuit board 10, and the other end opposite to the one end of the second printed circuit board 20 may be connected to the main board 40. The second printed circuit board 20 may be connected to the main board 40 by the adhesive layer 50.

The electronic device having the display unit according to the comparative example may require separate adhesive layers 50 between the display panel 30 and the first printed circuit board 10, between the first printed circuit board 10 and the second printed circuit board 20, and between the second printed circuit board 20 and the main board 40. In other words, since the electronic device having the display unit according to the comparative example requires a plurality of adhesive layers, the reliability of the electronic device may be lowered due to defective connection of the adhesive layer. In addition, the adhesive layer disposed between the first printed circuit board 10 and the second printed circuit board 20 that are vertically connected to each other may increase the thickness of the electronic device.

Referring to FIGS. 1b and 1c, the first printed circuit board 10, the second printed circuit board 20, the display panel 30, and the main board 40 which are housed in the electronic device according to the comparative example will be described.

FIG. 1b is a sectional view showing a state in which the printed circuit board of FIG. 1a is bent, and FIG. 1c is a bottom plan view of FIG. 1b.

The display panel 30 and the main board 40 may be opposed to each other. The first printed circuit board 10 including a bending region may be disposed between the display panel 30 and the main board 40 that face each other.

One region of the first printed circuit board 10 may be bent, and the first chip C1 may be disposed in a non-bending region.

In addition, the second printed circuit board 20 may face the display panel 30. The second chip C2 may be disposed in a non-bending region of the second printed circuit board 20.

Referring to FIG. 1c, since the comparative example requires a plurality of substrates, a length L1 in one direction may be the sum of lengths of the first printed circuit board 10 and the second printed circuit board 20. The length L1 of the first printed circuit board 10 and the second printed circuit board 20 in one direction may be the sum of a length of a short side of the first printed circuit board 10 and a length of a short side of the second printed circuit board 20. For example, the length L1 of the first printed circuit board 10 and the second printed circuit board 20 in one direction may be 30 mm to 40 mm. However, the length L1 of the first printed circuit board 10 and the second printed circuit board 20 in one direction may vary according to a type of a chip to be mounted and a type of the electronic device.

Since the electronic device according to the comparative example requires a plurality of printed circuit boards, a space for mounting other components or a space for arranging a battery 60 may be reduced.

Recently, an electronic device such as a smartphone has been additionally provided with components having various functions to enhance conveniences or security of a user. For example, the electronic device such as a smartphone or a smart watch may be equipped with a plurality of camera modules (dual camera module), or additionally provided with components with various functions such as iris recognition and virtual reality (VR). Accordingly, it is important to ensure a space for mounting additional components.

In addition, various electronic devices, including a wearable device, require expansion of a battery space in order to improve a convenience of the user.

Therefore, as the printed circuit boards used in the existing electronic device is replaced with one printed circuit board, an importance of ensuring a space for mounting new components or ensuring a space for expanding a battery size is increased.

In the electronic device according to the comparative example, different types of the first and second chips may be disposed on the first printed circuit board 10 and the second printed circuit board 30, respectively. Accordingly, a thickness of the adhesive layer 50 between the first printed circuit board 10 and the second printed circuit board 30 and the thickness of the second printed circuit board 30 may increase the thickness of the electronic device.

In addition, the battery space or the space for mounting other components may be reduced by a size of the second printed circuit board 30.

In addition, the bonding failure in the first and second printed circuit boards may lower the reliability of the electronic device.

In order to solve the above problems, the embodiment may provide a flexible circuit board having a novel structure capable of mounting a plurality of chips on one substrate, a chip package including the same, and an electronic device including the chip package. The same reference numerals in the embodiment and the comparative example denote the same components, and the duplicative description of the comparative example described above will be omitted.

Referring to FIGS. 2a to 2c, an electronic device including a flexible circuit board according to an embodiment will be described.

The electronic device according to the embodiment may use one printed circuit board to transmit a signal of a display panel to a main board. A printed circuit board included in the electronic device including the display unit according to the embodiment may be one flexible printed circuit board. Accordingly, a flexible printed circuit board 100 may be bent between the display unit and the main board that face each other to connect the display unit to the main board.

In detail, the flexible circuit board 100 according to the embodiment may be one substrate for arranging different types of a plurality of chips.

The flexible printed circuit board 100 according to the embodiment may be a substrate for arranging different types of the first chip C1 and the second chip C2.

A thickness t2 of the flexible printed circuit board 100 according to the embodiment may be 20 µm to 100 µm. For example, the thickness t2 of the flexible printed circuit board 100 may be 30 µm to 80 µm. For example, the thickness t2 of the flexible printed circuit board 100 may be 50 µm to 75 µm. However, the thickness of the flexible circuit board 100 according to the embodiment may be designed in various sizes according to the type of the chip to be mounted, the type of the electronic device, and the number of layers of the substrate constituting the flexible circuit board 100.

In this case, when the thickness t2 of the flexible circuit board 100 is less than 20 µm, the flexible circuit board 100 may be broken when the flexible circuit board 100 is curved (or bent), and breakage may occur due to heat generated from the mounted chip or the like.

The thickness t2 of the flexible printed circuit board 100 according to the embodiment may include a thickness of about ⅕ to ½ of the thickness t1 of the first and second printed circuit boards according to the comparative example. In other words, the thickness t2 of the flexible printed circuit board 100 according to the embodiment may include a thickness of about 20% to 50% of the thickness t1 of the first and second printed circuit boards according to the comparative example. For example, the thickness t2 of the flexible printed circuit board 100 according to the embodiment may include a thickness of about 25% to 40% of the thickness t1 of the first and second printed circuit boards according to the comparative example. For example, the thickness t2 of the flexible printed circuit board 100 according to the embodiment may include a thickness of about 25% to 35% of the thickness t1 of the first and second printed circuit boards according to the comparative example.

Since the electronic device having the display unit according to the embodiment may be formed of one flexible circuit board 100 between the display panel and the main board, the overall thickness of the electronic device can be reduced. In detail, since the electronic device having the display unit according to the embodiment requires a single-layer printed circuit board, the overall thickness of the electronic device can be reduced.

In addition, according to the embodiment, the adhesive layer 50 between the first printed circuit board and the second printed circuit board included in the comparative example may be omitted, so that an overall thickness of the chip package including the flexible circuit board and the electronic device including the chip package can be reduced.

In addition, according to the embodiment, since the adhesive layer 50 between the first printed circuit board and the second printed circuit board may be may omitted, the problems incurred by the adhesion failure can be solved, so that the reliability of the electronic device can be improved.

In addition, a bonding process for the printed circuit boards may be omitted, so that process efficiency can be increased, a process cost can be reduced.

In addition, since a substrate that has been managed in a separate process is treated in one process, the process efficiency and a product yield can be improved.

The flexible circuit board 100 according to the embodiment may include a bending region and a non-bending region. Since the flexible printed circuit board 100 according to the embodiment includes the bending region, and the display panel 30 and the main board 40 that face each other may be connected to each other.

The non-bending region of the flexible circuit board 100 according to the embodiment may face the display panel 30. The first chip C1 and the second chip C2 may be disposed on the non-bending region of the flexible circuit board 100 according to the embodiment. Accordingly, the flexible circuit board 100 according to the embodiment may be capable of stably mounting the first chip C1 and the second chip C2.

FIG. 2c is a bottom plan view of FIG. 2b.

Referring to FIG. 2c, since one substrate is required according to the embodiment, a length L2 in one direction may be a length of the one substrate. The length L2 of the flexible circuit board 100 in one direction according to the embodiment may be a length of a short side of the flexible circuit board 100 according to the embodiment. For example, the length L2 of the flexible printed circuit board 100 in one direction may be 10 mm to 50 mm. For example, the length L2 of the flexible printed circuit board 100 in one direction may be 10 mm to 30 mm. For example, the length L2 of the flexible printed circuit board 100 in one direction may be 15 mm to 25 mm. However, the embodiment is not limited thereto, and may be designed in various sizes according to the type and/or number of chips to be arranged and the type of the electronic device. According to the embodiment, a plurality of chips are mounted on one substrate, so that the length of the flexible circuit board can be reduced to 50 mm or less. When the length of the flexible circuit board is 10 mm or less, design freedom of the chips to be mounted may be reduced, and an interval between the chips may be narrow, which may affect mutual electrical characteristics of the chips.

The length L2 of the flexible circuit board 100 in one direction according to the embodiment may include a length of about 50% to 70% of the length L1 of the first and second printed circuit boards in one direction according to the comparative example. For example, the length L2 of the flexible circuit board 100 in one direction according to the embodiment may include a length of about 55% to 70% of the length L1 of the first and second printed circuit boards in one direction according to the comparative example. The length L2 of the flexible circuit board 100 in one direction according to the embodiment may include a length of about 60% to 70% of the length L1 of the first and second printed circuit boards in one direction according to the comparative example.

Accordingly, in the embodiment, the size of the chip package including the flexible circuit board 100 in the electronic device can be reduced, so that the space for arranging the battery 60 can be expanded. In addition, a planar area of the chip package including the flexible circuit board 100 according to the embodiment may be reduced, so that the space for mounting other components can be ensured.

Hereinafter, the flexible circuit board 100 and the chip package thereof according to the embodiment will be described with reference to the accompanying drawings.

In the following, a multilayer flexible printed circuit board according to a preferred embodiment will be described.

FIG. 3a is a sectional view showing a multilayer flexible circuit board according to another embodiment, FIG. 3b is a sectional view showing a chip package including the multilayer flexible circuit board of FIG. 3a, FIG. 4a is a sectional view showing a multilayer flexible circuit board according to still another embodiment, FIG. 4b is a sectional view showing the multilayer flexible circuit board according to still another embodiment, FIG. 5a is a sectional view showing a chip package including a multilayer flexible circuit board according to yet another embodiment, FIG. 5b is a sectional view showing the chip package including the multilayer flexible circuit board according to yet another embodiment, and FIG. 6 is a view showing the detailed configuration of a conductive pattern part and a via included in the multilayer flexible circuit board of FIG. 3a.

Referring to FIGS. 3a, 3b, 4a, 4b, 5a, 5b, 6, and 7, the multilayer flexible printed circuit board according to embodiments of the present invention will be described.

FIGS. 3a, 3b, 4a, 4b, 5a, and 5b are various sectional views showing the multilayer flexible printed circuit board according to embodiments, focusing on mounting the first chip and the second chip and connecting the display panel and the main board. In other words, FIGS. 3a, 3b, 4a, 4b, 5a, and 5b are views for describing various sectional structures of a third conductive pattern part for mounting the first chip, a second conductive pattern part for mounting the second chip, and a first conductive pattern part for connecting the display panel to the main board. In the above description, the display panel and the main board are described as being connected to the first conductive pattern part, but this is one embodiment, and a position of an outer lead connected to the display panel and the main board may be variously changed. This will be described in detail below with reference to the accompanying drawings.

Referring to FIGS. 3a, 3b, 4a, 4b, 5a, and 5b, a multilayer flexible printed circuit board 100 according to the embodiment may be a three-layer flexible printed circuit board having three electrode pattern parts.

In the present invention, the flexible circuit board 100 may be a multilayer flexible circuit board on which conductive pattern parts CP are disposed on surfaces of the plurality of substrates, respectively.

To this end, the multilayer flexible circuit board 100 according to the embodiment may include a substrate 110 including a first substrate 111 and a second substrate 112, and a wiring pattern layer 120 disposed on a bottom surface of the first substrate 111, on a top surface of the second substrate 112, and between the first substrate 111 and the second substrate 112.

In addition, a plating layer 130 and a protective layer 140 may be disposed on the wiring pattern layer 120 disposed on the bottom surface of the first substrate 111 and the wiring pattern layer 120 disposed on the top surface of the second substrate 112.

In the flexible circuit board 100 according to the embodiment, the wiring pattern layer 120 may be formed on the first substrate 111, and the second substrate 112 may be disposed on the first substrate 111 to cover the wiring pattern layer 120. Accordingly, after the wiring pattern layer 120, the plating layer 130, and the protective layer 140 are disposed on the top surface of the second substrate 112, the wiring pattern layer 120, the plating layer 130, and the protective layer 140 may be disposed on the bottom surface of the first substrate 111.

In addition, the flexible circuit board 100 according to the embodiment may have a source material in which a metal layer is formed on upper/lower portions of the first substrate 111, wherein the metal layer formed on the upper/lower portions of the first substrate 111 may be patterned to form the wiring pattern layer 120 on the upper/lower portions of the first substrate 111, and the second substrate 112 may be disposed on the first substrate 111 to cover the wiring pattern layer 120. Accordingly, after the wiring pattern layer 120 is formed on the top surface of the second substrate 112, the plating layer 130 and the protective layer 140 may be disposed on the top and bottom surfaces of the substrate.

The wiring pattern layer 120 may be formed on a top surface of the first substrate 111, the bottom surface of the first substrate 111, and the top surface of the second substrate 112.

Each wiring pattern layer 120 may include a metal material having excellent electrical conductivity. In more detail, the wiring pattern layer 120 may include copper (Cu). However, embodiments are not limited thereto, and the wiring pattern layer 120 may include at least metal of copper (Cu), aluminum (Al), chromium (Cr), nickel (Ni), silver (Ag), molybdenum (Mo), gold (Au), titanium (Ti), and an alloy thereof.

The wiring pattern layer 120 may have a thickness of 1 μm to 15 μm. For example, the wiring pattern layer 120 may have a thickness of 1 μm to 10 μm. For example, the wiring pattern layer 120 may have a thickness of 2 μm to 10 μm.

When the thickness of the wiring pattern layer 120 is less than 1 μm, a resistance of the wiring pattern layer may be increased. When the thickness of the wiring pattern layer 120 is greater than 10 μm, it may be difficult to implement a fine pattern.

The plating layer 130 may be disposed on the wiring pattern layer 120. The plating layer 130 may include a first plating layer 131 and a second plating layer 132.

The first plating layer 131 may be disposed on the wiring pattern layer 120, and the second plating layer 132 may be disposed on the first plating layer 131. The first plating layer 131 and the second plating layer 132 may be formed in two layers on the wiring pattern layer 120 to prevent a whisker from being formed. Accordingly, a short circuit can be prevented from occurring between patterns of the wiring pattern layer 120. In addition, since two plating layers are disposed on the wiring pattern layer 120, bonding characteristics with a chip can be improved. When the wiring pattern layer includes copper (Cu), the wiring pattern layer may not be directly bonded to the first chip C1, and a separate process for adhesion may be required. Meanwhile, when the plating layer disposed on the wiring pattern layer includes tin (Sn), a surface of the plating layer may be a pure tin layer, so that the plating layer may be easily bonding with the first chip C1. In this case, a wire connected to the first chip C1 may be easily connected to the pure tin layer only by heat and a pressure, so that accuracy of chip wire bonding and a convenience of a manufacturing process can be improved.

A region where the first plating layer 131 is disposed may correspond to a region where the second plating layer 132 is disposed. In addition, an area in which the first plating layer 131 is disposed may correspond to an area in which the second plating layer 132 is disposed.

The plating layer 130 may include tin (Sn). For example, the first plating layer 131 and the second plating layer 132 may include tin (Sn).

For example, the wiring pattern layer 120 may be formed of copper (Cu), and the first plating layer 131 and the second plating layer 132 may be formed of tin (Sn). When the plating layer 130 includes tin, since the tin (Sn) has an excellent corrosion resistance, the wiring pattern layer 120 can be prevented from being oxidized.

Meanwhile, a material of the plating layer 130 may have a lower electrical conductivity than a material of the wiring pattern layer 120. The plating layer 130 may be electrically connected to the wiring pattern layer 120.

The first plating layer 131 and the second plating layer 132 are formed of the same material that is tin (Sn), but may be formed by a separate process.

When the manufacturing process of the flexible circuit board according to the embodiment includes a heat treatment process such as thermosetting, copper (Cu) of the wiring pattern layer 120 or tin (Sn) of the plating layer 130 may be diffused. In detail, curing of the protective layer 140 may cause the diffusion of copper (Cu) of the wiring pattern layer 120 or tin (Sn) of the plating layer 130.

Accordingly, as a diffusion concentration of copper (Cu) decreases from the first plating layer 131 to the surface of the second plating layer 132, copper (Cu) content may be continuously decreased. Meanwhile, tin (Sn) content may be continuously increased from the first plating layer 131 to the surface of the second plating layer 132. Accordingly, an uppermost portion of the plating layer 130 may include a pure tin layer.

In other words, due to a chemical reaction at a lamination interface of the wiring pattern layer 120 and the plating layer 130, at least a part of the plating layer 130 may be an alloy of tin and copper. As compared with a thickness of the alloy of tin and copper after forming the plating layer 130 on the wiring pattern layer 120, a thickness of the alloy of tin and copper after curing the protective layer 140 on the plating layer 130 may be increased.

The alloy of tin and copper included in the at least a part of the plating layer 130 may have a chemical formula of $Cu_xSn_y$, wherein $0<x+y<12$. For example, in the above chemical formula, the sum of x and y may be represent as $4 \leq x+y \leq 11$. For example, the alloy of tin and copper included in the plating layer 130 may include at least one of $Cu_3Sn$ and $Cu_6Sn_5$. In detail, the first plating layer 131 may be an alloy layer of tin and copper.

In addition, the first plating layer 131 and the second plating layer 132 may have mutually different tin contents and copper contents. The first plating layer 131 making direct contact with the copper wiring pattern layer may have a greater copper content than the second plating layer 132. This will be described in detail below. Due to the diffusion of Cu/Sn, the plating layer according to the embodiment may prevent a electrochemical migration resistance, thereby preventing defective wire connection due to growth of a metal.

However, the embodiment is not limited thereto, and the plating layer 130 may include one of a Ni/Au alloy, gold (Au), electroless nickel immersion gold (ENIG), a Ni/Pd alloy, and organic solderability preservative (OSP).

The first plating layer 131 and the second plating layer 132 may have thicknesses that correspond to each other or are different from each other. An overall thickness of the first plating layer 131 and the second plating layer 132 may be 0.3 μm to 1 μm. The overall thickness of the first plating layer 131 and the second plating layer 132 may be 0.3 μm to 0.7 μm. The overall thickness of the first plating layer 131 and the second plating layer 132 may be 0.3 μm to 0.5 μm. The plating layer of one of the first plating layer 131 and the second plating layer 132 may have a thickness of 0.05 μm to 0.15 μm or less. For example, the plating layer of one of the first plating layer 131 and the second plating layer 132 may have a thickness of 0.07 μm to 0.13 μm or less.

The protective layer 140 may be partially disposed on the wiring pattern layer 120. For example, the protective layer 140 may be disposed on the plating layer 130 on the wiring pattern layer 120. The protective layer 140 may cover the plating layer 130 to prevent the wiring pattern layer 120 and the plating layer 130 from being damaged or separated due to oxidation.

The protective layer 140 may be partially disposed in a region except for a region where the wiring pattern layer 120 and/or the plating layer 130 are electrically connected to the display panel 30, the main board 40, the first chip C1, or the second chip C2.

Accordingly, the protective layer 140 may partially overlap the wiring pattern layer 120 and/or the plating layer 130.

An area of the protective layer 140 may be smaller than an area of the substrate 110. The protective layer 140 may be disposed in a region except for an end of the substrate, and may include a plurality of open regions.

The protective layer 140 may include an open region having a hole-like shape. In this case, the open region may be a region for opening a region where a chip is disposed. In addition, the open region may be a region that exposes an opening formed in the substrate.

The protective layer 140 may include an insulating material. The protective layer 140 may include various materials that may be applied and heated so as to be cured in order to protect a surface of the conductive pattern part. The protective layer 140 may be a resist layer. For example, the protective layer 140 may be a solder resist layer including an organic polymer material. For example, the protective layer 140 may include an epoxy acrylate-based resin. In detail, the protective layer 140 may include a resin, a curing agent, a photoinitiator, a pigment, a solvent, a filler, an additive, an acryl-based monomer, and the like. However, the embodiment is not limited thereto, and the protective layer 140 may be one of a photo solder resist layer, a cover-lay, and a polymer material.

The protective layer 140 may have a thickness of 1 μm to 20 μm. The protective layer 140 may have a thickness of 1 μm to 15 μm. For example, the thickness of the protective layer 140 may be 5 μm to 20 μm. When the thickness of the protective layer 140 is greater than 20 μm, the thickness of the flexible circuit board may be increased. When the thickness of the protective layer 140 is less than 1 μm, reliability of the conductive pattern part included in the flexible circuit board may be reduced.

Hereinafter, the bottom surface of the first substrate 111 and the top surface of the second substrate 112 may be referred to as top and bottom surfaces of the substrate 110 or one surface and the other surface of the substrate 110.

In other words, an upper wiring pattern layer, an upper plating layer, and an upper protective layer may be disposed on the one surface of the substrate 110 according to the embodiment, and a lower wiring pattern layer, a lower plating layer, and a lower protective layer may be disposed on the other surface opposite to the one surface. In addition, a central wiring pattern layer may be disposed inside the substrate 110, that is, between the first substrate 111 and the second substrate 112.

In addition, when the flexible circuit board 100 according to the embodiment has the source material in which the metal layer is formed on the upper/lower portions of the first substrate 111, the metal layer formed on the upper/lower portions of the first substrate 111 is patterned to form the wiring pattern layer 120 on the upper/lower portions of the first substrate 111, the second substrate 112 is disposed on the first substrate 111 to cover the wiring pattern layer 120, and accordingly, the wiring pattern layer 120 is formed on the top surface of the second substrate 112, a thickness of the upper wiring pattern layer may be different from a thickness of the central wiring pattern layer and a thickness of the lower wiring pattern layer, and the thickness of the upper wiring pattern layer may be smaller than the thickness of the central wiring pattern layer and the thickness of the lower wiring pattern layer because the wiring pattern layer 120 is formed on the top surface of the second substrate 112 separately from the source material.

The upper wiring pattern layer may include a metal material corresponding to metal materials of the central wiring pattern layer and the lower wiring pattern layer. Accordingly, the process efficiency can be improved. However, the embodiment is not limited thereto, and the upper wiring pattern layer may include other conductive materials.

The thickness of the upper wiring pattern layer, the thickness of the central wiring pattern layer, and the thickness of the lower wiring pattern layer may correspond to each other. Accordingly, the process efficiency can be improved. Meanwhile, since the upper wiring pattern layer and the lower wiring pattern layer are disposed on an outer surface of the substrate, the upper wiring pattern layer and the lower wiring pattern layer are exposed to an outside, and the central wiring pattern layer is protected by the first substrate 111 and the second substrate 112.

Therefore, the plating layer and the protective layer may be disposed on the upper wiring pattern layer and the lower wiring pattern layer, and the plating layer and the protective layer may not be disposed on the central wiring pattern layer. In this case, the upper plating layer may be disposed on the upper wiring pattern layer, and the lower plating layer may be disposed on the lower wiring pattern layer. Since the upper and lower plating layers are applied, adhesion with a chip mounted on the flexible circuit board or adhesion with the display and the main board connected to the flexible circuit board may be easily performed, and electrical characteristics can be improved.

Meanwhile, the upper plating layer may include a metal material corresponding to a metal material of the lower plating layer. Accordingly, the process efficiency can be improved. However, the embodiment is not limited thereto, and the upper plating layer may include other conductive materials.

A thickness of the upper plating layer may correspond to a thickness of the lower plating layer. Accordingly, the process efficiency can be improved.

The substrate 110 may include a plurality of through-holes. The through-holes of the substrate 110 may be formed respectively or simultaneously by a mechanical process or a chemical process. For example, the through-holes of the substrate 110 may be formed by a drill process or an etching process. For example, the through-hole of the substrate may be formed through a punching and desmear process by a laser. The desmear process may be a process of removing a polyimide smear attached to an inner side surface of the through-hole. Through the desmear process, an inner surface of a polyimide substrate may have an inclined surface similar to a straight line.

In this case, the through-holes may be formed through both the first substrate 111 and the second substrate 112 that constitute the substrate 110, may be formed through only the first substrate 111, and may be formed through only the second substrate 112. In this case, the through-hole may be also referred to as a via hole.

The wiring pattern layer 120, the plating layer 130, and the protective layer 140 may be disposed on the substrate 110. In detail, the wiring pattern layer 120, the plating layer 130, and the protective layer 140 may be sequentially disposed on both surfaces of the substrate 110. In addition, the wiring pattern layer 120 may also be disposed between the first substrate 111 and the second substrate 112 that constitute the substrate 110.

The wiring pattern layer 120 may be formed by at least one of evaporation, plating, and sputtering.

For example, a wiring layer for forming a circuit may be formed by electroplating after sputtering. For example, the wiring layer for forming the circuit may be a copper plating layer formed by electroless plating. Alternatively, the wiring layer may be a copper plating layer formed by the electroless plating and by electrolytic plating.

Next, after laminating a dry film on the wiring layer, a patterned wiring layer may be formed on both surfaces, that is, the top and bottom surfaces of the flexible circuit board through exposure, development, and etching processes. Accordingly, the wiring pattern layer 120 may be formed.

A conductive material may be filled in via holes V1, V2, V3, V4, V5, and V6 formed through the substrate 110. The conductive material filled in the via hole may be a conductive material corresponding to or different from a conductive material of the wiring pattern layer 120. For example, the conductive material filled in the via hole may include at least metal of copper (Cu), aluminum (Al), chromium (Cr), nickel (Ni), silver (Ag), molybdenum (Mo), gold (Au), titanium (Ti), and an alloy thereof. An electrical signal of the second conductive pattern part CP2 on the top surface of the second substrate 112 may be transmitted through the conductive material filled in the via hole to the third conductive pattern part CP3 between the first substrate 111 and the second substrate and to the first conductive pattern part CP1 on the bottom surface of the first substrate 111.

Next, the plating layer 130 may be formed on the wiring pattern layer 120 that constitute the first, second, and third conductive pattern parts CP1, CP2, and CP3. In this case, the plating layer 130 may be formed only on a partial region of the wiring pattern layer 120, or may be formed on an entire region of the wiring pattern layer 120. In addition, the plating layer 130 may be formed only on the first and second conductive pattern parts.

Thereafter, a protective part PP may be screen-printed on the first and second conductive pattern parts CP1 and CP2.

Accordingly, the first conductive pattern part CP1, the second conductive pattern part CP2, and the third conductive pattern part CP3 may include the plating layer 130 in addition to the wiring pattern layer 120. However, a part of the third conductive pattern part CP3 may include only the wiring pattern layer 120, and a remaining part may further include the plating layer 130 in addition to the wiring pattern layer 120. In this case, the remaining part may be an inner lead part corresponding to a region of the third conductive pattern part CP3 in which the first chip C1 is mounted.

In the following, the relation between the plating layer 130 and the wiring pattern layer 120 constituting the first conductive pattern part CP1, the second conductive pattern part CP2, and the third conductive pattern part CP3 will be described. In this case, the wiring pattern layer of the first conductive pattern part CP1 may be referred to as a lower wiring pattern layer, the wiring pattern layer constituting the second conductive pattern part CP2 may be referred to as an upper wiring pattern layer, and the wiring pattern layer constituting the third conductive pattern part CP3 may be referred to as a central wiring pattern layer.

Meanwhile, each of the first to third conductive pattern parts may include a lead pattern region and an extension region. The third conductive pattern part may include a first inner lead pattern part and a first extension pattern part. In this case, the first inner lead pattern part may be a part exposed through the opening of the second substrate. In addition, the first extension pattern part may be a part covered by the second substrate except for the first inner lead pattern part. In addition, the second conductive pattern part may include a second inner lead pattern part and a second extension pattern part. In this case, the second inner lead pattern part may be a part exposed through the open region of the opening. In addition, the second extension pattern part may be a part covered by the protective layer except for the second inner lead pattern part. In addition, the first conductive pattern part may include an outer lead pattern part and a third extension pattern part. In this case, the outer lead pattern part may be a part exposed through the open region of the protective layer. In addition, the third extension pattern part may be a part covered by the protective layer except for the outer lead pattern part.

Areas of the upper and lower wiring pattern layers 120 may correspond to or different from an area of the plating layer 130. An area of the first plating layer 131 may correspond to or different from an area of the second plating layer 132.

Referring to FIG. 3a, the areas of the upper and lower wiring pattern layers 120 may correspond to the area of the plating layer 130. The area of the first plating layer 131 may correspond to the area of the second plating layer 132.

Referring to FIGS. 4a and 4b, the areas of the upper and lower wiring pattern layers 120 may be different from the area of the plating layer 130.

Referring to FIG. 4a, the area of the first plating layer 131 may correspond to the area of the second plating layer 132. In addition, the area of each of the first plating layer 131 and the second plating layer 132 may be smaller than the areas of the upper and lower wiring layers 120. In other words, the first plating layer 131 and the second plating layer 132 may be selectively formed only on exposure regions exposed to the outside among surfaces of the upper and lower wiring pattern layers 120. Accordingly, since the plating layer required for facilitating connection with the chip is disposed only at a connection part with the chip, an amount of the plating layer is reduced, so that a material cost can be reduced.

Referring to FIG. 4b, the areas of the upper and lower wiring pattern layers 120 may correspond to the area of the first plating layer 131. The area of the first plating layer 131 may be different from the area of the second plating layer 132. For example, the area of the first plating layer 131 may be greater than the area of the second plating layer 132.

In this case, the first plating layer 131 may be formed to facilitate bonding between the wiring pattern layer and the second plating layer 132. In addition, the second plating layer 132 may be formed to facilitate the bonding with the chip. In this case, when the plating is performed on the wiring pattern layer only once, the material of the wiring pattern layer may penetrate into the plating layer. In addition, the penetration of the material of the wiring pattern layer may degrade the adhesion between the chip and the plating layer, resulting in the adhesion failure. However, in the present invention, the first plating layer is formed in an inner lead region where the chip is mounted. Accordingly, the penetration of the material of the wiring pattern layer may proceed to the surface of the first plating layer. Thereafter, the second plating layer is further formed on the first plating layer so that the material of the wiring pattern layer penetrating into the first plating layer may not penetrate into the second plating layer. Accordingly, only a pure plating layer may exist on the surface of the second plating layer adhered to the chip, so that the adhesion with the chip may be improved.

Referring to FIG. 7, an area of the upper wiring pattern layer 120 on the top surface of the second substrate 112 is different from the area of the plating layer 130, an area of the lower wiring pattern layer 120 on the bottom surface of the first substrate 111 may correspond to the area the plating layer 130. Accordingly, a pattern design is complicated for the top surface where the chip is mounted, and the pattern design is relatively simple for the bottom surface to which the panel or the main board is attached as compared with the top surface, so that the process efficiency can be improved. In addition, cracks of the plating layer on the top surface, which is located on an outer side portion of the substrate when the substrate is bent, may be reduced.

The protective layer 140 may make direct contact with the substrate 110, make direct contact with the wiring pattern layer 120, make direct contact with the first plating layer 131, or make direct contact with the second plating layer 132.

Referring to FIG. 3a, the first plating layer 131 may be disposed on the upper and lower wiring pattern layers 120, the second plating layer 132 may be formed on the first plating layer 131, and the protective layer 140 may be partially disposed on the second plating layer 132.

In addition, referring to FIG. 4a, the protective layer 140 may be partially disposed on the upper and lower wiring pattern layers. In addition, the first plating layer 131 and the second plating layer 132 may be disposed in a region other than a region the protective layer is disposed on the upper and lower wiring pattern layers.

In addition, referring to FIG. 4b, the first plating layer 131 may be disposed on the upper and lower wiring pattern layers 120, and the protective layer 140 may be partially disposed on the first plating layer 131. The second plating layer 132 may be disposed in a region other than a region where the protective layer 140 is disposed on the plating layer 131.

The first plating layer 131 making contact with a bottom surface of the protective layer 140 may be an alloy layer of copper and tin. The second plating layer 132 making contact with a side surface of the protective layer 140 may include pure tin. Accordingly, the protective layer can be prevented from being separated due to formation of a cavity between the protective layer 140 and the first plating layer 131, and a whisker can be prevented from being formed, so that the adhesion of the protective layer can be increased. Therefore, the embodiment may provide an electronic device which includes two plating layers so that the reliability is increased.

In addition, when only the tin plating layer 131, which is a single layer, is disposed on the upper and lower wiring pattern layers 120, and the protective layer 140 is disposed on one tin plating layer 131, as the tin plating layer 131 is heated during the thermosetting of the protective layer 140, copper may be diffused in the tin plating layer 131. Accordingly, the tin plating layer 131 may be the alloy layer of tin and copper, so that the first chip having a gold bump may not be firmly mounted. Therefore, the plating layer 130 according to the embodiment requires the first plating layer 131 and the second plating layer 132 in which tin concentrations are continuously increased as a distance from the substrate increases.

Referring to FIG. 6, the upper, central, and lower wiring pattern layers 120 may include a plurality of layers. In addition, each of the upper, central, and lower wiring pattern layers 120 may include the first wiring pattern layer 121, the second wiring pattern layer 122, and the third wiring pattern layer 133. In addition, the first plating layer 131 may be disposed on at least a partial region of a top surface of the third wiring pattern layer 133.

The first wiring pattern layer 121 may be disposed on the surfaces of the first substrate 111 and the second substrate 112. The first wiring pattern layer 121 may be a metal seed layer for improving adhesion between the substrate 110 and the second wiring pattern layer 122. In this case, the metal seed layer may be formed by the sputtering. The metal seed layer may include nickel and chromium. In other words, the first wiring pattern layer 121 may be an alloy layer of nickel and chromium. Preferably, the first wiring pattern layer 121 may be an alloy layer in which nickel and chromium is mixed with each other at a ratio of nickel:chromium=8:2.

In addition, the second and third wiring pattern layers 122 and 123 may be formed on the first wiring pattern layer 121. The second wiring pattern layer 122 may be formed on the first wiring pattern layer 121. The second wiring pattern layer 122 may be formed by the sputtering. The second wiring pattern layer 122 may include copper.

The second wiring pattern layer 122 and the third wiring pattern layer 123 may be formed by processes that correspond to each other or are different from each other.

In other words, as described above, the second wiring pattern layer 122 may be formed by sputtering copper in a thickness of 0.1 μm to 0.5 μm. The second wiring pattern layer 122 may be disposed on the surfaces of the first substrate 111 and the second substrate 112. The third wiring pattern layer 123 may be formed by plating copper on the second wiring pattern layer 122. In this case, since the thickness of the second wiring pattern layer 122 is thin, wiring formation for signal transmission may not be efficiently performed, so that the third wiring pattern layer 123 may be further formed on the second wiring pattern layer 122.

In other words, since the first wiring pattern layer 121 is formed by the sputtering, the first wiring pattern layer 121 has excellent adhesion with the substrate 110 or the metal seed layer, whereas a manufacturing cost is high, and a manufacturing time is long. Therefore, the third wiring pattern layer 123 is formed on the second wiring pattern layer 122 by the plating, so that the manufacturing cost can be reduced, and the manufacturing time can be shortened.

Meanwhile, a via pattern layer may be also formed in the via hole. In this case, the via pattern layer may include a first via pattern layer V1-2 and a second via pattern layer V1-2.

The first via pattern layer V1-2 may be formed on an inner wall of the via hole formed through the first substrate 111 and the second substrate 112. The first via pattern layer V1-2 may be formed on an inner wall of the via hole to make contact with the first substrate 111 and the second substrate 112. The first via pattern layer V1-2 may be formed by the sputtering. Alternatively, the first via pattern layer V1-2 may be formed by the plating. The first via pattern layer V1-2 may be a metal seed layer including palladium. In this case, since the first via pattern layer V1-2 is thin, inner side surfaces of the via holes may be spaced apart from each other. The second via pattern layer V1-2 is formed to fill the via hole. The second via pattern layer V1-2 may be formed by plating a metal including copper. In this case, the second via pattern layer V1-2 may be formed together with the third wiring pattern layer 123 by filling an inside of the via hole during the plating of the third wiring pattern layer 123. Accordingly, the embodiment may provide a flexible circuit board and an electronic device including the same, in which a void is prevented from being formed in the via hole so that the reliability can be improved.

Referring to FIG. 7, a plurality of protective layers 140 may be disposed on the top surface of the second substrate 112. The protective layer may include a first protective layer 141 and a second protective layer 142.

For example, the first protective layer 141 may be partially disposed on the top surface of the second substrate 112, and the upper wiring pattern layer 120 may be disposed on a region other than a region where the protective layer 141 is disposed.

The second protective layer 142 may be disposed on the protective layer 141. The second protective layer 142 may cover the first protective layer 141 and the upper wiring pattern layer 120, and may be disposed in a region greater than the first protective layer 141.

The protective layer 142 may be disposed on a region corresponding to the protective layer 141 while surrounding a top surface of the first protective layer 141. A width of the second protective layer 142 may be greater than a width of the protective layer 141. Accordingly, a bottom surface of the second protective layer 142 may make contact with the upper wiring pattern layer 120 and the first protective layer 141. Accordingly, the second protective layer 142 may alleviate concentration of stress at an interface between the first protective layer 141 and the wiring pattern layer 120. Therefore, film separation or cracks that may occur upon the bending of the flexible circuit board according to the embodiment may be reduced.

The plating layer 130 constituting the second conductive pattern part CP2 may be disposed in a region other than a region where the second protective layer 142 is disposed. In detail, the first plating layer 131 is disposed on the upper wiring pattern layer 120 in a region other than the region where the second protective layer 142 is disposed, and the second plating layer 132 may be sequentially disposed on the first plating layer 131.

The lower wiring pattern layer 120 may be disposed on the bottom surface of the first substrate 111. The plating layer 130 may be disposed on the lower wiring pattern layer 120. The protective layer 140 may be partially disposed on the plating layer 130.

Meanwhile, the first substrate 111 and the second substrate 112 may have mutually different thicknesses.

The first substrate 111 may be a flexible substrate. Accordingly, the first substrate 111 may be partially bent. In other words, the first substrate 111 may include a flexible plastic. For example, the first substrate 111 may be a polyimide (PI) substrate. However, the embodiment is not limited thereto, and the first substrate 111 may be a substrate formed of a polymer material such as polyethylene terephthalate (PET) and polyethylene naphthalate (PEN). Accordingly, the flexible circuit board including the first substrate 111 may be used in various electronic devices having a curved display device. For example, since the flexible circuit board including the first substrate 111 has excellent flexibility, the flexible circuit board including the first substrate 111 may be suitable for mounting a semiconductor chip of a wearable electronic device. In detail, the embodiment may be suitable for electronic devices that include a curved display.

The first substrate 111 may be an insulating substrate. In other words, the first substrate 111 may be an insulating substrate for supporting various wiring patterns.

The first substrate 111 may have a thickness of 5 μm to 75 μm. For example, the first substrate 111 may have a thickness of 10 μm to 50 μm. For example, the first substrate 111 may have a thickness of 30 μm to 40 μm.

The second substrate 112 may be disposed on the first substrate 111. In this case, the second substrate 112 may be disposed on the first substrate 111 to cover a part of the third conductive pattern part CP3 disposed on the first substrate 111. Preferably, the second substrate 112 may have an opening that exposes at least a part of an upper region of the first substrate 111. In this case, the opening may form a first open region OA1 together with the upper protective layer.

In this case, the second substrate 112 may be formed of a liquid polyimide (PI). In other words, the first substrate 111 may serve as a core, and the second substrate 112 may be supported by the first substrate 111 and formed by applying the liquid polyimide on the first substrate 111. In this case, the thickness of the second substrate 112 may be different from the thickness of the first substrate 111. For example, the thickness of the second substrate 112 may be smaller than the thickness of the first substrate 111. In this case, the first substrate 111 and the second substrate 112 may constitute the substrate 110. In this case, the liquid polyimide is applied after patterning the first conductive pattern part CP1 and the third conductive pattern part CP3 on the surface of the first substrate 111. In this case, the liquid polyimide may have a uniform thickness according to a thickness of a support part on a lower portion. Therefore, the first substrate 111 has a predetermined thickness to serve as the support part for forming the second substrate 112, and the first substrate 111 may serve as a support, so that the second substrate 112 may have a thickness smaller than the thickness of the first substrate 111. Accordingly, the material cost can be reduced.

The second substrate 112 may have a thickness of 2 μm to 75 μm. For example, the first substrate 111 may have a thickness of 5 μm to 50 μm.

In the case where the second substrate 112 is smaller than 2 μm, the third conductive pattern part CP3 may be exposed, or a crack may occur when the second substrate 112 is formed due to a height of the third conductive pattern part CP3. Meanwhile, when the second substrate 112 is greater than 75 μm, the overall thickness of the substrate may become thick, and it may take a long time to form the via hole in the second substrate 112, so that the process efficiency may be decreased.

In the following, referring to FIGS. 3a, 3b, 4a, 4b, 5a, and 5b, the connection relation between the first chip C1, the second chip C2, the display panel 30, and the main board 40 mounted on the multilayer flexible printed circuit board 100 according to the embodiment will be described.

The multilayer flexible circuit board 100 according to the embodiment may include: the substrate 100 including the first substrate 111 and the second substrate 112 which include a through-hole; the lower wiring pattern layer 120 disposed on the bottom surface of the first substrate 111; the upper wiring pattern layer 120 disposed on the top surface of the second substrate 112; the central wiring pattern layer 120 disposed between the first substrate 111 and the second substrate 112; the first plating layer 131 disposed on the wiring pattern layers 120; the second plating layer 132 disposed on the first plating layer 131; and the protective layer 140 partially disposed on the second plating layer 132.

In this case, the region where the protective layer 140 is disposed on the first substrate 111 and the second substrate 112 may be the protective part PP. In addition, the first conductive pattern part CP1 and the second conductive pattern part CP2 may be exposed to the outside in a region other than the protective part PP. In other words, in the open region of the protective layer or the region where the protective part is not disposed on the first and second conductive pattern parts, the first and second conductive pattern parts CP1 and CP2 may be electrically connected to the second chip C2, the display panel 30, and the main board 40 directly or indirectly.

In addition, as described above, the second substrate 112 may have the opening that exposes a region to which the first chip C1 is attached from the upper region of the first substrate 111. In addition, the opening may vertically overlap the open region of the protective layer. Therefore, the region to which the first chip C1 is attached from the upper region of the first substrate 111 may be exposed through the opening of the second substrate 112 and the open region of the protective layer. In addition, in a region where the second substrate 112 and the protective layer are not disposed, the third conductive pattern part CP3 may be directly connected to the first chip C1.

In other words, in the multilayer flexible circuit board of the embodiment, the inner lead pattern part connected to the first chip C1 and the inner lead pattern part connected to the at least one second chip C2 may be disposed on different layers. In this case, the first chip C1 may have more terminals than the second chip C2. In other words, a plurality of chips may be disposed on the multilayer flexible printed circuit board. In this case, a first chip having the greatest number of terminals among the chips may be disposed on the first substrate 111, and at least one second chip other than the first chip may be disposed on the second substrate 112. Preferably, the first chip C1 may be a drive IC chip. In addition, the at least one second chip C2 may be one of a diode chip, a power supply IC chip, a touch sensor IC chip, an MLCC chip, a BGA chip, and a chip capacitor.

More preferably, a plurality of second chips may be disposed on the second substrate 112. In this case, the total number of terminals of the first chip C1 disposed on the first substrate 111 may be greater than the total number of terminals of the second chips disposed on the second substrate 112. As described above, in the present invention, the first chip C1 having the greatest number of terminals is disposed on the first substrate 111, so that overlapping arrangement of channel wirings formed between the first substrate 111 and the second substrate 112 can be minimized. In addition, since the first chip C1 having the greatest number of terminals is formed on the first substrate 111, the number of vias formed for connecting the first chip C1 can be minimized, so that the process efficiency can be improved. Moreover, since the first chip C1 having the greatest number of terminals is formed on the first substrate 111, a first inner lead and a first extension part (third conductive pattern part) which occupy the greatest number of inner leads and extension parts are formed in the central wiring pattern layer, so that the design autonomy of the upper wiring pattern layer and the lower wiring pattern layer may be increased.

Meanwhile, a lead pattern part and a the test pattern part of the multilayer flexible circuit board according to the embodiment may not overlap the protective part. In other words, the lead pattern part and the test pattern part may refer to first, second, and third conductive pattern parts CP1, CP2, and CP3 located in the open region which is not covered by the protective layer, and may be classified into the lead pattern part and the test pattern part according to functions thereof.

The lead pattern part may refer to a conductive pattern part for connecting the first chip, the second chip, the display panel, or the main board.

The test pattern part may refer to a conductive pattern part for checking defective products of the flexible circuit board and the chip package including the same according to the embodiment.

The lead pattern part may be divided into an inner lead pattern part and an outer lead pattern part according to positions thereof. One region of the third conductive pattern part CP3, which is relatively close to the first chip C1 and is not overlapped by the protective layer, may be represented as a first inner lead pattern part. One region of the second conductive pattern part CP2, which is relatively close to the second chip C2 and is not overlapped by the protective layer, may be represented as a second inner lead pattern part. One region of the first conductive pattern part CP1, which is relatively far from the first chip C1 and the second chip C2 and is not overlapped by the protective layer, may be represented as an outer lead pattern part.

The multilayer flexible printed circuit board 100 according to the embodiment may include a first inner lead pattern part I1 and a second inner lead pattern part I2. The first inner lead pattern part I1 may be a part of the third conductive pattern part CP3 disposed on the first substrate 111. In addition, the second inner lead pattern part I2 may be a part of the second conductive pattern part CP2 disposed on the second substrate 112.

In addition, the first inner lead pattern part I1 may include a first sub-first inner lead pattern part I1a, a second sub-first inner lead pattern part I1b, and a third sub-first inner lead pattern part I1c.

In addition, the second inner lead pattern part I2 may include a first sub-second inner lead pattern part I2a, a second sub-second inner lead pattern part I2b, a third sub-second inner lead pattern part I3a, and a fourth sub-second inner lead pattern part I3b. In this case, the number of second inner lead pattern parts I2 may correspond to the number of second chips C2 disposed on the second substrate 112. In other words, as the number of the second chips C2 disposed on the second substrate 112 increases, the number of the second inner lead pattern parts I2 may be increased.

In addition, the multilayer flexible printed circuit board 100 according to the embodiment may include an outer lead pattern part O1. In this case, the outer lead pattern part O1 may include a first sub-first outer lead pattern part O1a and a second sub-first outer lead pattern part O1b. The first sub-first outer lead pattern part O1a may be a lead pattern part to which one of the display panel and the main board is connected, and the second sub-first outer lead pattern part O1b may be a lead pattern part to which the remaining one of the display panel and the main board is connected.

In this case, as shown in FIGS. 3a, 3b, 4a, and 4b, both of the first sub-first outer lead pattern part O1a and the second sub-first outer lead pattern part O1b may be disposed on the bottom surface of the first substrate 111. In other words, both the display panel 30 and the main board 40 may be connected under the first substrate 111.

Alternatively, as shown in FIG. 5a, both of the first sub-first outer lead pattern part O1a and the second sub-first outer lead pattern part O1b may be disposed on the top surface of the second substrate 112. In other words, both the display panel 30 and the main board 40 may be connected over the second substrate 112.

Alternatively, as shown in FIG. 5b, the first sub-first outer lead pattern part O1a may be disposed on the bottom surface of the first substrate 111. In addition, the second sub-first outer lead pattern part O1b may be disposed on the top surface of the second substrate 112. In other words, the display panel 30 may be connected under the first substrate 111, and the main board 40 may be connected over the second substrate 112.

In addition, although not shown in the drawings, at least a part of the third conductive pattern part CP3 disposed on the top surface of the first substrate 111 may form at least one of the first sub-first outer lead pattern part O1a and the second sub-first outer lead pattern part O1b. Accordingly, at least one of the display panel 30 and the main board 40 may be connected between the first substrate 111 and the second substrate 112.

Meanwhile, when the first chip C1 and the second chip C2 are disposed on the top surface of the first substrate 111 and the top surface of the second substrate 112, respectively, the arrangement shown in FIG. 3b is most preferable among arrangements of the display panel 30 and the main board 40.

Accordingly, the following description will focus on the arrangement shown in FIG. 3b.

In addition, the multilayer flexible printed circuit board 100 according to the embodiment may include a first test pattern part T1 and a second test pattern part T2.

The first inner lead pattern part I1 may be disposed on the first substrate 111 of the multilayer flexible printed circuit board according to the embodiment. In addition, the second inner lead pattern part I2 may be disposed on the second substrate 112. In addition, the first outer lead pattern part O1 may be disposed under the first substrate 111. In addition, the first test pattern part T1 and the second test pattern part T2 may be further disposed under the first substrate 111.

The first chip C1 may be attached to the first inner lead pattern part I1 of the multilayer flexible printed circuit board 100 according to the embodiment through a first connection part 70. In other words, the first chip C1 may be connected to the first sub-first inner lead pattern part I1a, the second sub-first inner lead pattern part I1b, and the third sub-first inner lead pattern part I1c through the first connection part 70.

The first connection part 70 may include a first sub-first connection part 71, the second sub-first connection part 72, and the third sub-first connection part 73 according to positions and/or functions thereof.

The first chip C1 disposed on the first substrate 111 of the multilayer flexible circuit board according to the embodiment may be electrically connected to the first sub-first inner lead pattern part I1a through the first sub-first connection part 71.

The first sub-first inner lead pattern part I1a may transmit an electrical signal to the first via hole V1 along the top surface of the first substrate 111. In addition, the first via hole V1 may be electrically connected to the first sub-first outer lead pattern part O1a. In other words, the first sub-first inner lead pattern part I1a may exchange signals with the first sub-first outer lead pattern part O1a.

Meanwhile, the display panel 30 may be connected onto the first sub-first outer lead pattern part O1a through the adhesive layer 50. Accordingly, a signal transmitted from the first chip may be transmitted to the display panel 30 via the first sub-first inner lead pattern part I1a and the first sub-first outer lead pattern part O1a.

In addition, the first chip C1 may be electrically connected to the second sub-first inner lead pattern part I2 through the second sub-first connection part 72.

The second sub-first inner lead pattern part I1b disposed on the top surface of the first substrate 111 may transmit the electrical signal to the first test pattern part T1 adjacent to the second via hole V2 along the bottom surface of the first substrate 111 through the conductive material filled in the second via hole V2 disposed under the second sub-first inner lead pattern part I1b.

The first test pattern part T1 may check a failure in the electrical signal that may be transmitted through the second via hole V2. For example, an accuracy of the signal transmitted to the second sub-first inner lead pattern part I1b may be confirmed through the first test pattern part T1. In detail, as a voltage or a current is measured at the first test pattern part T1, it is possible to confirm the occurrence or a position of a short circuit or an electrical short of the conductive pattern part disposed between the first chip and the display panel, so that the reliability of the product can be improved.

In addition, the second sub-first inner lead pattern part I1b disposed on the top surface of the first substrate 111 may be electrically connected to the second sub-first outer lead pattern part O1b along the bottom surface of the first substrate 111 through the conductive material filled in the third via hole V3.

Meanwhile, the main board 40 may be connected on the second sub-first outer lead pattern part O1b through the adhesive layer 50. Accordingly, the signal transmitted from the first chip may be transmitted to the main board 40 via the second sub-first inner lead pattern part I1b and the second sub-first outer lead pattern part O1b.

According to the embodiment, the first chip C1 may be electrically connected to the third sub-first inner lead pattern part I1c through the third sub-first connection part 73.

The third sub-first inner lead pattern part I1c disposed on the top surface of the first substrate 111 may be connected to the first sub-second inner lead pattern part I2a or the third sub-second inner lead pattern part I3a through the metal material filled in the fourth via hole V4 or the metal material filled in the fifth via hole. Therefore, the first chip C1 may be electrically connected to at least one second chip C2 through the third sub-first inner lead pattern part I1c.

The second test pattern part T2 may check a failure in the electrical signal that may be transmitted through the third via hole V3. For example, an accuracy of the signal transmitted to the second sub-first outer lead pattern part O1b may be confirmed through the second test pattern part T2. In detail, as a voltage or a current is measured at the second test pattern part T2, it is possible to confirm the occurrence or a position of a short circuit or an electrical short of the conductive pattern part disposed between the first chip and the main board 40, so that the reliability of the product can be improved.

Meanwhile, a first sub-second chip C2a may be connected to the first sub-second inner lead pattern part I2a through the first sub-second connection part 81. In addition, the first sub-second chip C2a may be connected to the second sub-second inner lead pattern part I2b through the second sub-second connection part 82. In addition, the second sub-second chip C2b may be connected to the third sub-second inner lead pattern part I3a through a first sub-third connection part 91. In addition, the second sub-second chip C2b may be connected to the fourth sub-second inner lead pattern part I3b through the second sub-third connection part 92.

In addition, the second sub-first outer lead pattern part O1b may be connected to the second sub-second inner lead pattern part I2b through the third via hole V3 and the fourth via hole V4. In addition, the second sub-first outer lead pattern part O1b may be connected to the fourth sub-second inner lead pattern part I3b through the fifth via hole V5 and the sixth via hole V6.

Meanwhile, in the following, a manufacturing process of the chip package including the multilayer flexible circuit board as described above will be described.

First, the first substrate 111, the second substrate 112 and the conductive pattern part CP, and the protective layer 140 are arranged to prepare the multilayer flexible printed circuit board as shown in FIG. 3a.

In this case, the protective layer 140 may include a first open region OA1 and a second open region OA2. In addition, the first open region OA1 may be an opening vertically overlapping the opening formed in the second substrate 112. Accordingly, at least a part of the third conductive pattern part disposed on the top surface of the first substrate 111 may be exposed.

In other words, the second plating layer 132 constituting the third conductive pattern part CP3 disposed on the first substrate may be exposed in the opening. In this case, the opening may be referred to as the first open region OA1. In the following, for convenience of explanation, a part exposed through the opening of the second substrate 112 will be referred to as the first open region OA1. In addition, the second plating layer 132 of the second conductive pattern part CP2 disposed on the second substrate 112 may be exposed in the second open region OA2.

A manufacturing process of the chip package after manufacturing the multilayer flexible circuit board as described above will be described by a first step of arranging the first chip C1 in the multilayer flexible circuit board and a second step of arranging the second chip C2 in the multilayer flexible circuit board.

First, the arranging of the first chip C1 on the flexible circuit board according to the embodiment will be described.

The first connection part 70 may be disposed in the first open region OA1 of the flexible circuit board according to the embodiment.

The tin (Sn) content of the second plating layer 132 of the third conductive pattern part CP3 in the first open region OA1 may be 50 atomic % or more. In the first open region OA1, the second plating layer 132 of the third conductive pattern part CP3 may include a pure tin layer. For example, the tin (Sn) content of the second plating layer 132 of the third conductive pattern part CP3 in the first open region OA1 may be 70 atomic % or more. For example, the tin (Sn) content of the second plating layer 132 of the third conductive pattern part CP3 in the first open region OA1 may be 90 atomic % or more. For example, the tin (Sn) content of the second plating layer 132 of the third conductive pattern part CP3 in the first open region OA1 may be 95 atomic % or more. For example, the tin (Sn) content of the second plating layer 132 of the third conductive pattern part CP3 in the first open region OA1 may be 98 atomic % or more. When the tin (Sn) content of the second plating layer 132 of the third conductive pattern part CP3 in the first open region OA1 is less than 50 atomic %, it may be difficult to connect the second plating layer 132 of the third conductive pattern part CP3 and the first chip C1 by the connection part 70. In detail, when the tin (Sn) content of the second plating layer 132 of the third conductive pattern part CP3 in the first open region OA1 is less than 50 atomic %, it may be difficult to make connection by the bonding of the second plating layer 132 and the first chip C1 through the connection part 70.

The first connection part 70 may include gold (Au). The first connection part 70 may be a gold bump.

In order to arrange one first chip C1 on the flexible circuit board according to the embodiment, a plurality of first connection parts 70 may be disposed between the first chip C1 and the second plating layer 132 of the third conductive pattern part CP3.

Since the second plating layer 132 of the third conductive pattern part CP3 in the first open region OA1 has the tin (Sn) content of 50 atomic % or more, the second plating layer 132 may have excellent adhesion characteristics with the first connection part 70 including gold (Au). The chip package including the multilayer flexible printed circuit board according to the embodiment may have excellent electrical connection between the first chip C1 and the conductive pattern through the first connection part 70, so that the reliability can be improved.

Next, the arranging of the second chip C2 on the multilayer flexible circuit board according to the embodiment will be described.

A second connection part 80 is disposed in the second open region OA2 of the multilayer flexible printed circuit board according to the embodiment.

In order to arrange the second chip C2 on the multilayer flexible circuit board according to the embodiment, heat may be selectively supplied only to a part corresponding to a region where the second connection part 80 is disposed through a mask (not shown). In detail, the embodiment may selectively supply the heat to the region where the second connection part 80 for connecting the second chip C2 is disposed through a selective reflow process.

In detail, in the multilayer flexible printed circuit board according to the embodiment, even when the second chip C2 is arranged after mounting the first chip C1, partial heat supply may be possible through the selective reflow process.

In other words, in the manufacturing process according to the embodiment, the first open region OA may be prevented from being exposed to the heat through the mask. Accordingly, the second plating layer disposed in the first open region OA may be prevented from being denatured from the pure tin layer to the alloy layer of tin and copper by the supply of the heat. Accordingly, even when the first chip C1 and the second chip C2, which are different from each other, are mounted on one multilayer flexible printed circuit board 100, the tin (Sn) content of the second plating layer 132 in the first open region may be 50 atomic % or more, so that an assembly of the drive IC chip may be excellent.

Meanwhile, a hole of the mask may be disposed in a region corresponding to the second open region OA2. Accordingly, the plating layer exposed by the heat in the second open region OA2 may be denatured into the alloy layer of tin and copper.

In detail, a part of the second plating layer 132 in the second open region OA2 exposed by the heat through the hole of the mask may be subject to further tin/copper diffusion. Accordingly, the tin (Sn) content of the second plating layer 132 may be less than 50 atomic % in the second open region OA2. In the second open region OA2, the second plating layer 132 may be the alloy layer of copper (Cu) and tin (Sn).

The second connection part 80 may include a metal other than gold (Au). Accordingly, even when the second plating layer 132 disposed under the second connection part 80 is not a pure tin layer, the second connection part 80 may have an excellent assembly performance with the second chip C2. In addition, since the second connection part 80 may include the metal other than gold (Au), the manufacturing cost can be reduced.

For example, the second connection part 80 may include at least one of copper (Cu), tin (Sn), aluminum (Al), zinc (Zn), indium (In), lead (Pb), antimony (Sb), bismuth (bi), silver (Ag), and nickel (Ni).

The second connection part 80 may be a solder bump. The second connection part 80 may be a solder ball. At a temperature of the reflow process, the solder ball may be melted.

In order to arrange one second chip C2 on the flexible circuit board according to the embodiment, a plurality of second connection parts 80 may be disposed between the second chip C2 and the second plating layer 132.

At the temperature of the reflow process, the second chip C2 may have excellent bonding with the second plating layer 132 on the second open region OA2 through the second connection part 80.

In the multilayer flexible printed circuit board according to the embodiment, the connection of the first chip C1 may be excellent through the first connection part 70 in the first open region, and simultaneously, the connection of the second chip C2 may be excellent through the second connection part 80 in the second open region.

The flexible printed circuit board according to the embodiment may include plating layers having different Sn contents in the first open region OA1 and the second open region OA2, so that the assembly performance of the first chip C1 may be excellent, and simultaneously, the assembly performance of the second chip C2 may be excellent.

As in the comparative example, when the first chip is mounted on the first printed circuit board, the second chip is mounted on the second printed circuit board, and the first printed circuit board having the first chip and the second printed circuit board having the second chip are bonded with each other by the adhesive layer, problems due to the thermal denaturation of the first chip may not occur.

However, when the first and second chips different from each other are mounted on one substrate as in the embodiment, the second plating layer is denatured by the heat in the first open region of the protective layer for connecting the first chip, so that there has been a problem that the assembly of the first chip by the first connection part is difficult.

In order to solve such a problem, the inventor sequentially arranged the first chip and the second chip on the multilayer flexible circuit board through the selective reflow process. Accordingly, in the multilayer flexible printed circuit board and the chip package including the same, the tin content of the second plating layer in the first open region may be different from the tin content of the second plating layer in the second open region. Therefore, in the chip package including the multilayer flexible circuit board according to the embodiment, excellent electrical connection of the first chip C1 and the second chip C2 which are different from each other can be achieved.

The second plating layer including the pure tin layer in the first open region may enable stable mounting of the first chip, which is the drive IC chip, through the first connection part including gold (Au). In addition, the second plating layer including the alloy layer of copper and tin in the second open region may enable stable mounting of the second chip, which is at least one of a diode chip, a power supply IC chip, a touch sensor IC chip, an MLCC chip, a BGA chip, and a chip capacitor, through the second connection part including the metal other than gold (Au).

Accordingly, in the multilayer flexible printed circuit board and the chip package including the same according to the embodiment, different types of the first and second chips can be mounted on one flexible printed circuit board with an excellent yield.

In addition, a plurality of conventional printed circuit boards may be replaced with one multilayer flexible circuit board, so that the multilayer flexible circuit board for connecting the display panel and the main board can be miniaturized and can be thin.

Therefore, in the electronic device including the multilayer flexible circuit board of the embodiment, various functional units such as a camera module, an iris recognition module, and the like can be easily mounted. In addition, in the electronic device including the multilayer flexible circuit board of the embodiment, the battery space can be expanded.

In addition, the multilayer flexible circuit board may be manufactured through a roll-to-roll process, and the chip may be mounted on the multilayer flexible circuit board through the selective reflow process, so that a convenience of the manufacturing process and a manufacturing yield can be improved.

In the multilayer flexible printed circuit board according to the embodiment, the display panel 30 may be disposed on the other surface opposite to the one surface of the first substrate 111 on which the first chip C1 is disposed, so that the design freedom can be improved. In addition, since the display panel is disposed on the other surface opposite to the one surface on which the second chips are mounted, heat dissipation may be effectively performed. Accordingly, the reliability of the flexible circuit board according to the embodiment can be improved.

In addition, the embodiment provides the multilayer flexible circuit board, so that a signal according to the high resolution can be effectively transmitted.

Further, in the embodiment, in a multilayer structure including the first substrate 111 and the second substrate 112, the second substrate 112 may be formed to expose at least a part of the upper region of the first substrate 111. In other words, the second substrate 112 may have an opening that exposes at least a part of the upper region of the first substrate 111. In addition, the first chip C1 may be disposed on the first substrate 111 exposed through the opening of the second substrate 112, and at least one second chip C2 is disposed on the second substrate 112. In this case, the first chip C1 is a chip having the greatest number of terminals among a plurality of chips disposed on the multilayer flexible printed circuit board. Preferably, the first chip C1 may be a drive IC chip. In addition, the second chip C2 having a relatively small number of terminals may be disposed on the second substrate 112. Accordingly, in the embodiment, the number of connection wirings (including wiring pattern layers and via holes) for connecting the first chip C1 can be minimized, and thus a volume of the flexible circuit board can be minimized. In addition, in the embodiment, most of a design portion of the first chip C1, which occupies the greatest part of a wiring design of a double-sided flexible circuit board, may be applied as it is, and accordingly, a design time can be minimized.

FIG. 8 is a plan view showing the first substrate 111 of FIG. 3a, and FIG. 9 is a bottom view showing the first substrate 111 of FIG. 3a.

FIGS. 8 and 9 are top and bottom plan views showing the first substrate 111 in the multilayer flexible circuit board according to the embodiment, focusing on the third conductive pattern part for arranging the first chip.

Referring to FIGS. 8 and 9, the multilayer flexible circuit board 100 of the embodiment may be provided on both outer sides thereof with sprocket holes formed in a longitudinal direction of the multilayer flexible circuit board 100 for the sake of convenience of fabrication or processing. Therefore, the first substrate 111 may be wound or unwound by the sprocket hole in a roll-to-roll scheme.

The first substrate 111 may be defined as an inner region IR and an outer region OR based on a cut part shown by a dotted line.

In the inner region IR of the first substrate 111, a conductive pattern part for connecting the first chip, the display panel, and the main board may be disposed. Meanwhile, a conductive pattern part for connecting the second chip may be disposed in the inner region IR of the top surface of the second substrate 112.

As a portion where the sprocket hole of the first substrate 111 is formed may be cut off, and the chip may be disposed on the first substrate, the first substrate 111 may be processed into the chip package including the flexible circuit board 100 and the electronic device including the chip package.

Referring to FIG. 8, in the top surface of the flexible circuit board 100, the first sub-first inner lead pattern part I1a, the second sub-first inner lead pattern part I1b, and the third sub-first inner lead pattern part I1c, which are one regions of the third conductive pattern part CP3, may be exposed to the outside through the first open region OA1 of the protective layer 140 and the opening of the second substrate 112.

Referring to FIG. 9, in the bottom surface of the flexible circuit board 100, the first sub-first outer lead pattern part O1a and the second sub-first outer lead pattern part O1b, which are one regions of the first conductive pattern part CP1, may be exposed to the outside through the third open region OA3 of the protective layer 140.

Referring to FIGS. 3b and 10 to 14, the chip package including the first chip C1 and the second chip C2 on the multilayer flexible circuit board 100 according to the embodiment will be described in detail.

FIG. 10 is a plan view schematically showing the chip package including the multilayer flexible circuit board 100 in which the first chip and the second chip are mounted according to the embodiment.

Referring to FIGS. 10a and 10b, the multilayer flexible printed circuit board 100 according to the embodiment may include arranging the first chip C1 and the second chip C2 on different surfaces of a plurality of substrates. In this case, the first chip C1 and the second chip C2 are shown as being disposed on the same layer in FIG. 10, since the first chip C1 is viewed from the top as the first chip C1 is exposed to the outside through the opening of the second substrate 112 and the first open region of the protective layer.

In a three-layer flexible circuit board 100 according to the embodiment, a length in a lateral direction (x-axis direction) may be greater than a length in a longitudinal direction (y-axis direction). In other words, the three-layer flexible circuit board 100 according to the embodiment may include two long sides in the lateral direction and two short sides in the longitudinal direction.

Each of the first chip C1 and the second chip C2 may have a length in the lateral direction (x-axis direction) which is greater than a length in the longitudinal direction (y-axis direction). In other words, the first chip C1 and the second chip C2 may include two long sides in the lateral direction and two short sides in the longitudinal direction.

The long side of the three-layer flexible printed circuit board 100 according to the embodiment may be parallel with each of the long side of the first chip C1 and the long side of the second chip C2, so that the chips may be efficiently disposed on one multilayer flexible printed circuit board 100.

The lateral length (long side) of the first chip C1 may be greater than the lateral length (long side) of the second chip C2. The longitudinal length (short side) of the first chip C1 may be smaller than the longitudinal length (short side) of the second chip C2. Referring to FIG. 10a, the second chip C2 may be disposed on an upper portion of the second substrate so as not to vertically overlap the first chip C1.

The first chip C1 may be the drive IC chip. The second chip C2 may include the second chip C2a selected from one of a diode chip, a power supply IC chip, a touch sensor IC chip, an MLCC chip, a BGA chip, and a chip capacitor, and the second chip C2b selected from another one of the diode chip, the power supply IC chip, the touch sensor IC chip, the MLCC chip, the BGA chip, and the chip capacitor.

Referring to FIGS. 11 to 14, the manufacturing process of the chip package including the multilayer flexible circuit board according to the embodiment will be described.

FIG. 11 is a plan view showing the multilayer flexible circuit board 100 according to the embodiment.

Referring to FIGS. 11a and 11b, the protective layer 140 disposed on one surface of the multilayer flexible printed circuit board 100 may include a plurality of holes. In other words, the protective layer 140 may include a plurality of open regions. In this case, it is shown in the following drawings that the second conductive pattern part CP2 and the third conductive pattern part CP3 are formed on different layers so as not to overlap each other in the vertical direction. However, the drawings are provided only for convenience of explaining of each of the conductive pattern part, so the second conductive pattern part CP2 and the third conductive pattern part CP3 may be substantially disposed such that at least parts of the second conductive pattern part CP2 and the third conductive pattern part CP3 overlap each other in the vertical direction. In addition, the second conductive pattern part CP2 and the third conductive pattern part CP3 may be electrically connected to each other through the metal material filled in the via hole. In the following, for convenience of explanation, only parts of the second conductive pattern part CP2 and the third conductive pattern part CP3 will be shown in the drawings for explanation.

The first open region OA1 of the protective layer may be a region exposed so as to be connected to the first connection part 70. The third conductive pattern part CP3 disposed on the first substrate 111 exposed in the first open region OA1 of the protective layer may include a pure plating on a surface thereof facing the first connection part. In other words, the tin content of the second plating layer included in the third conductive pattern part CP3 in the first open region OA1 of the protective layer may be 50 atomic % or more.

The second open region OA2 of the protective layer may be a region exposed so as to be connected to the second connection part 80. The second conductive pattern part CP2 exposed in the second open region OA2 of the protective layer may include the alloy layer of copper and tin on a surface thereof facing the second connection part. In other words, the tin content of the second plating layer included in the second conductive pattern part CP2 in the second open region OA2 of the protective layer may be less than 50 atomic %.

The first open region OA1 may be disposed on a region vertically overlapping the opening of the second substrate 112, and accordingly, the first open region OA1 may be a region for connecting the first chip onto the first substrate 111. The third conductive pattern part CP3 and the first sub-first inner lead pattern part I1a may have widths that correspond to each other or are different from each other. For example, a width W1 of the third conductive pattern part CP3 may correspond to a width W2 of the first sub-first inner lead pattern part I1a. For example, the width W1 of the third conductive pattern part CP3 may be greater than the width W2 of the first sub-inner lead pattern part I1a. In detail, a difference between the width W1 of the first extension pattern part of the third conductive pattern part CP3 and the width W2 of the first sub-first inner lead pattern part I1 may be within 20%. Accordingly, a plurality of third conductive pattern parts CP3 may be formed in an intermediate pattern layer.

The first sub-first inner lead pattern part I1a and the third sub-first inner lead pattern part I1c extending toward an inside of the first open region OA1 may have widths corresponding to each other.

The widths of the first extension pattern part of the third conductive pattern part CP3 extending toward an outer side of the substrate from the first open region OA1 may correspond to each other for each region. Accordingly, the width of the first extension pattern part is set such that the first chip having a fine line width and requiring a large number of first connection parts is formed in the intermediate pattern layer, and the second chip having a large line width and requiring a small number of second connection parts is formed in an upper pattern layer, so that both the first chip and the second chip may be mounted on one multilayer flexible printed circuit board 100. In this case, the fine line width may refer to a case where a line width of one of the first sub-first inner lead pattern part I1*a* and the third sub-first inner lead pattern part I1*c* is smaller than a line width of one of the second inner lead pattern part I2 and a third inner lead pattern part I3. Meanwhile, the large line width may refer to a case where a line width of one of the second inner lead pattern part I2 and the third inner lead pattern part I3 is relatively greater than a line width of the first inner lead pattern part I1.

The multilayer flexible printed circuit board 100 of the embodiment may include a plurality of second open regions OA2*a* and OA2*b* for connecting different types of second chips C2*a* and C2*b*, respectively.

One second open region OA2*a* may be a region for connecting one second chip C2*a*. A width W3 of the second inner lead pattern part I2 disposed in the second open region OA2 may be greater than a width W4 of the second extension pattern part of the second conductive pattern part CP2 (preferably, the extension pattern part of the second conductive pattern part). In detail, the width W3 of the second inner lead pattern part I2 may be at least 1.5 times greater than the width W4 of the extension pattern part of the second conductive pattern part CP2. In other words, the second conductive pattern part CP2 may include the second inner lead pattern part I2, the third inner lead pattern part I3, and the extension pattern part.

In other words, since the third conductive pattern part having a plurality of leads connected to the first chip C1 is formed in the intermediate pattern layer, the second inner lead pattern part connected to the second chip C2 of the upper pattern layer having design freedom may be large, so that the connection between the second chip C2 and the flexible circuit board may be facilitated. In addition, the width W3 of the second inner lead pattern part I2 is greater than the width W4 of the extension pattern part of the second conductive pattern part CP2, so that the design freedom can be increased when forming the extension pattern part having a length relatively longer than a length of the second inner lead pattern part in the upper pattern layer.

The other second open region OA2*b* may be a region for connecting the other second chip C2*b*. The second conductive pattern part CP2 extending toward the outer side of the substrate from the third inner lead pattern part I3 disposed in the second open region OA2*b* may have different widths. For example, a width W5 of the third inner lead pattern part I3 may be greater than a width W6 of the third conductive pattern part CP3. In detail, the width W5 of the third inner lead pattern part I3 may be at least 1.5 times greater than the width W6 of the third conductive pattern part CP3.

At least one of the width W3 of the second inner lead pattern part I2 and the width W5 of the third inner lead pattern part I3 exposed through the second open region may be greater than the width W2 of the first inner lead pattern part I1 exposed through the first open region. Accordingly, lead pattern parts may be formed to correspond to various sizes/shapes of the first and second connection parts, so that the design freedom can be improved. Further, the first inner lead pattern part that is provided in the largest number is formed in the intermediate pattern layer, so that the design freedom can be improved when forming a relatively small number of the second and third inner lead pattern parts and the extension pattern part of and the second conductive pattern part in the upper pattern part. In other words, the embodiment may include the inner lead pattern part of various sizes and shapes suitable for different types of the first and second chips, so that an optimal chip package may be achieved.

The shape of the inner lead pattern part disposed under the first chip may be different from the shape of the inner lead pattern part disposed under the second chip. Accordingly, the embodiment may include inner lead pattern parts having different shapes, each of which may have excellent adhesion characteristics with different types of the first and second chips. Therefore, in the multilayer flexible printed circuit board according to the embodiment, bonding characteristics of the first chip and the second chip may be excellent.

In other words, the inner lead pattern parts having different shapes may be an optimal pattern design in which different types of the first and second chips are mounted on one substrate to ensure a predetermined bonding performance.

The first inner lead pattern part I1 when viewed from the top may be formed in a stripe pattern having a rectangular shape. In detail, the first inner lead pattern part I1 when viewed from the top may be formed in a stripe pattern having a rectangular shape which has a uniform width and extends in one direction. For example, widths of one end and the other end of the first inner lead pattern part I1 may be the same. Accordingly, a large number of terminals of the first chip and the first inner lead may be bonded to each other.

For example, the second inner lead pattern part I2 or the third inner lead pattern part I3 may be formed in a protruding pattern having various shapes such as a polygonal shape, a circular shape, an elliptical shape, a hammer shape, a T-shape, and a random shape. In detail, the second inner lead pattern part I2 or the third inner lead pattern part I3 may be formed in a protruding pattern having various shapes such as a polygonal shape, a circular shape, an elliptical shape, a hammer shape, a T-shape, and a random shape having a variable width and extending in a direction different from the one direction. For example, one end and the other end of at least one of the second inner lead pattern part I2 and the third inner lead pattern part I3 may have different widths. The width of the other end of the second inner lead pattern part I2 and the third inner lead pattern part I3, which is far from the protective layer, may be greater than the width of the one end which is close to the protective layer. However, the embodiment is not limited thereto, and the width of the other end of the second inner lead pattern part I2 and the third inner lead pattern part I3, which is far from the protective layer, may be smaller than the width of the one end which is close to the protective layer. Accordingly, when bonding a relatively smaller number of terminals as compared with the first chip to the second inner lead, the terminals and the second inner lead may be bonded in a large space, so that bonding efficiency can be improved.

For example, when the second chip is an MLCC chip, the inner lead pattern part may have a T shape such as the second inner lead pattern part I2 of FIG. 11*b*.

For example, when the second chip is a BGA chip, the inner lead pattern part may have a circular shape such as the third inner lead pattern part I3 of FIG. 11*a*. Alternatively, when the second chip is the BGA chip, the inner lead pattern part may have a semicircular shape or a rounded end shape, such as the third inner lead pattern part I3 of FIG. 11*b*.

In other words, a more efficient design may be ensured to connect the second chip (MLCC, BGA, etc.) having a wider terminal width and a smaller number of terminals than the first chip (drive IC).

The shapes of the first inner lead pattern part and the first connection part may be the same. For example, the first inner lead pattern part and the first connection part may have a rectangular shape when viewed from the top. In this case, the shapes of the first inner lead pattern part and the first connection part being the same means that the first inner lead pattern part and the first connection part have the same polygonal shape when viewed from the top, and may include different sizes.

The shapes of the second inner lead pattern part and the second connection part 80 may be the same or different from each other. The shapes of the third inner lead pattern part and the third connection part 90 may be the same or different from each other.

Referring to FIGS. 11a and 12a, the second inner lead pattern part I2 may have a polygonal shape when viewed from the top, and the second connection part may have a circular shape when viewed from the top. The third inner lead pattern part I3 may have a circular shape when viewed from the top, and the third connection part may have a circular shape.

Referring to FIGS. 11b and 12b, the second inner lead pattern part I2 may have a polygonal shape when viewed from the top, and the second connection part may have a rectangular shape with rounded corners or an elliptical shape when viewed from the top. A seventh inner lead pattern part I7 may have a long semi-circle shape when viewed from the top, and the second connection part may have a circular shape.

The first connection part 70 may have a shape in which a lateral length and a longitudinal length (aspect ratio) correspond to or differ from each other when viewed from the top. For example, the first connection part 70 may have a square shape in which a lateral length and a longitudinal length (aspect ratio) correspond to each other or a rectangular shape in which a lateral length and a longitudinal length (aspect ratio) differ from each other when viewed from the top.

The second connection part 80 may have a shape in which a lateral length and a longitudinal length (aspect ratio) correspond to or differ from each other when viewed from the top. For example, the second connection part 80 may have a circular shape in which a lateral length and a longitudinal length (aspect ratio) correspond to each other or an elliptical shape in which a lateral length and a longitudinal length (aspect ratio) differ from each other when viewed from the top.

A first pitch P1, which is an interval between adjacent third conductive pattern parts CP3, may be smaller than a second pitch P2, which is an interval between adjacent second conductive pattern parts CP2. In this case, the first pitch and the second pitch may refer to an average separation interval between two adjacent conductive pattern parts. Accordingly, a part including a large number of inner leads connected to the chip having a large number of terminals may be formed in the intermediate pattern layer, so that a plurality of chips may be formed on one printed circuit board.

The first pitch P1 may be less than 30 µm. For example, the first pitch may be 5 µm to 25 µm. For example, the first pitch may be 5 µm to 15 µm.

When the first pitch P1 is less than 5 um, an electrical short may occur between the third conductive patterns connected to the drive IC. When the first pitch P1 is 30 um or more, in order to form all the third conductive patterns for the drive IC in the intermediate layer, the length L2 of the flexible circuit board may be increased, so that it may be difficult to ensure a space for arranging additional components, such as batteries, in the electronic device.

The second pitch P2 may be 30 µm or more. For example, the second pitch may be 30 µm to 500 µm. For example, the second pitch may be 100 µm to 300 µm.

When the second pitch P2 is less than 30 um, an electrical short may occur between the second conductive patterns connected to the MLCC or BGA chip. When the second pitch P2 is 300 um or more, in order to form all the second conductive patterns for chips such as the MLCC or the BGA in the upper layer, the length L2 of the flexible circuit board may be increased, so that it may be difficult to ensure a space for arranging additional components, such as batteries, in the electronic device.

Accordingly, it is possible to prevent a signal between the conductive pattern part connected to each of the first chip and the second chip from being interfered, and the accuracy of the signal can be improved.

A planar area of the first inner lead pattern part I1 in the first open region OA1 may correspond to or may be different from the first connection part 70.

The width of the first inner lead pattern part I1 and the width of the first connection part 70 may be the same or may have a difference within 20%. Accordingly, the first inner lead pattern part I1 and the first connection part 70 may be stably mounted. In addition, the adhesion characteristics between the first inner lead pattern part I1 and the first connection part 70 may be improved.

A planar area of one of the inner lead pattern part I2 and the third inner lead pattern part I3 in the second open region OA2 may correspond to or may be different from the second connection part 80.

For example, the width of the second connection part 80 may be at least 1.5 times larger than the width of one of the inner lead pattern part I2 and the third inner lead pattern part I3. Accordingly, the width of the second connection part 80 may be provided so that the adhesion characteristics between the second connection part 80 and one of the second inner lead pattern part I2 and the third inner lead pattern part I3 may be improved.

Referring to FIGS. 12a and 12b, the arranging of the first connection part 70 and the second connection part 80 on the flexible circuit board 100 of the embodiment will be described.

The first connection part 70 may be disposed on the first inner lead pattern part I1 exposed through the first open region OA1. For example, the first connection part 70 may cover all or a part of a top surface of the first inner lead pattern part I1.

The total number of a plurality of first inner lead pattern parts I1 spaced apart from each other may correspond to the number of first connection parts 70.

For example, referring to FIGS. 13a and 13b, when the number of a plurality of first sub-first inner lead pattern parts I1a spaced apart from each other is nine, and the number of a plurality of third sub-first inner lead pattern parts I1c spaced apart from each other is nine, the number of the first connection parts 70 may be 18, which is the sum of the number of the first sub-first inner lead pattern parts I1a, which is 9, and the number of the third sub-first inner lead pattern parts I1c spaced apart from each other, which is 9.

The second connection part 80 may be disposed on each of the second inner lead pattern part I3 and the third inner lead pattern part I3 exposed through the second open region OA2. For example, the second connection part 80 may cover all or a part of top surfaces of the second inner lead pattern part I2 and the third inner lead pattern part I3.

The number of a plurality of second inner lead pattern parts I2 spaced apart from each other may correspond to the number of the second connection part 80 and the number of the third connection part 90 disposed on the third inner lead pattern part I3.

For example, referring to FIGS. 13a and 13b, the number of the second inner lead pattern parts I2 spaced apart from each other may be two, and the number of the second connection parts 80 disposed on the second inner lead pattern part I2 may be two.

The number of a plurality of third inner lead pattern parts I3 spaced apart from each other may correspond to the number of third connection parts 90 disposed on the third inner lead pattern part I3.

For example, referring to FIGS. 13a and 13b, the number of the third inner lead pattern parts I3 spaced apart from each other may be three, and the number of the third connection parts 90 disposed on the third inner lead pattern part I3 may be three.

Each of the second connection part 80 and the third connection part 90 may be larger than the first connection part 70. Since the width of the second inner lead pattern part I2 or the third inner lead pattern part I3 exposed through the second open region is greater than the width of the first inner lead pattern part I1 exposed through the first open region, each of the second connection part 80 and the third connection part 90 may be larger than the first connection part 70.

Referring to FIGS. 13a and 13b, the arranging of the first chip C1 and the second chips C2a and C2b on the multilayer flexible printed circuit board 100 of the embodiment will be described.

The first chip C1 may be disposed on the first connection part 70.

The first chip C2 may be disposed on the second connection part 80.

In order to prevent problems such as signal interferences, failures such as disconnection, and failures due to heat, the first chip C1 and the second chip C2 may be spaced apart from each other by a predetermined distance in a vertical direction without overlapping in the vertical direction.

The multilayer flexible printed circuit board 100 according to the embodiment may implement a conductive pattern part having a fine pitch in three layers, so that the multilayer flexible printed circuit board 100 may be suitable for an electronic device having a high-resolution display unit.

In addition, since the multilayer flexible printed circuit board 100 according to the embodiment is flexible, small in size, and thin in thickness, the multilayer flexible printed circuit board 100 may be used in various electronic devices.

For example, referring to FIG. 14, the multilayer flexible printed circuit board 100 according to the embodiment may be used for an edge display because a bezel may be reduced.

For example, referring to FIG. 15, the multilayer flexible printed circuit board 100 according to the embodiment may be included in a bending flexible electronic device. Therefore, a touch device including the multilayer flexible printed circuit board 100 may be a flexible touch device. Thus, a user may bend or curve the device by a hand. Such a flexible touch window may be applied to a wearable touch or the like.

For example, referring to FIG. 16, the multilayer flexible printed circuit board 100 according to the embodiment may be applied to various electronic devices that employ a foldable display device. Referring to FIGS. 16a to 16c, a foldable cover window may be folded in the foldable display device. The foldable display device may be included in various portable electronic products. In detail, the foldable display device may be included in a mobile terminal (mobile phone), a notebook computer (portable computer), and the like. Accordingly, a display area of the portable electronic product can be increased while a size of the device can be reduced during storage or transfer, so that portability can be improved. Therefore, the convenience of the user of the portable electronic product can be improved. However, the embodiment is not limited thereto, and the foldable display device may be used in other electronic products.

Referring to FIG. 16a, the foldable display device may include one folding region in a screen region. For example, the foldable display device may have a C-shape when folded. In other words, one end of the foldable display device and the other end opposite to the one end may overlap each other. In this case, the one end and the other end may be close to each other. For example, the one end and the other end may face each other.

Referring to FIG. 16b, the foldable display device may include two folding regions in the screen region. For example, the foldable display device may have a G-shape when folded. In other words, one end of the foldable display device and the other end opposite to the one end may overlap each other as the one end and the other end are folded in the corresponding direction. In this case, the one end and the other end may be spaced apart from each other. For example, the one end and the other end may be parallel to each other.

Referring to FIG. 16c, the foldable display device may include two folding regions in the screen region. For example, the foldable display device may have an S-shape when folded. In other words, one end of the foldable display device and the other end opposite to the one end may be folded in different directions. In this case, the one end and the other end may be spaced apart from each other. For example, the one end and the other end may be parallel to each other.

In addition, although not shown in the drawings, the flexible circuit board 100 according to the embodiment may be applied to a rollable display.

Referring to FIG. 17, the multilayer flexible printed circuit board 100 according to the embodiment may be included in various wearable touch devices including a curved display. Therefore, the electronic device including the multilayer flexible printed circuit board 100 according to the embodiment may have a slim, miniaturized, or light-weight configuration.

Referring to FIG. 18, the multilayer flexible printed circuit board 100 according to the embodiment may be used in various electronic devices having a display portion, such as TVs, monitors, and notebook computers.

However, the embodiment is not limited thereto, and the flexible circuit board 100 according to the embodiment may be used in various electronic devices having a flat or curved display portion.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A flexible circuit board comprising:
a first substrate;
a second substrate disposed on the first substrate and including an opening;
a first conductive pattern part disposed on a bottom surface of the first substrate;
a second conductive pattern part disposed on a top surface of the second substrate;
a third conductive pattern part disposed between the first substrate and the second substrate; and
an upper protective layer partially disposed on the second conductive pattern part and including a first open region,
wherein the third conductive pattern part includes:
a first inner lead pattern part disposed in the opening of the second substrate and non-overlapped with the second conductive pattern part in a vertical direction; and
a first extension pattern part connected to the first inner lead pattern part,
wherein the first inner lead pattern part is exposed to an outside of the flexible circuit board through the opening of the second substrate and the first open region of the upper protective layer,
wherein the second conductive pattern part includes:
a second inner lead pattern part disposed in the first open region of the upper protective layer; and
a second extension pattern part connected to the second inner lead pattern part, and
wherein total a number of first inner lead pattern parts is greater than a total number of second inner lead pattern parts,
wherein the first open region of the upper protective layer is overlapped with the opening of the second substrate in the vertical direction, and a width of the first open region is greater than a width of the opening of the second substrate.

2. The flexible circuit board of claim 1, wherein a width of the first inner lead pattern part is smaller than a width of the second inner lead pattern part.

3. The flexible circuit board of claim 1, wherein a width of the first extension pattern part is smaller than a width of the second extension pattern part.

4. The flexible circuit board of claim 2, wherein a pitch between the first inner lead pattern parts is smaller than a pitch between the second inner lead pattern parts.

5. The flexible circuit board of claim 3, wherein a pitch between first extension pattern parts is smaller than a pitch between second extension pattern parts.

6. The flexible circuit board of claim 1, wherein at least one of the first to third conductive pattern parts includes:
a conductive pattern layer; and
a plating layer disposed on the conductive pattern layer and including tin,
wherein the plating layer of the at least one of the first to third conductive pattern parts comprises:
a first plating layer disposed on the conductive pattern layer; and
a second plating layer disposed on the first plating layer.

7. The flexible circuit board of claim 6, wherein the conductive pattern layer of the at least one of the first to third conductive pattern parts includes:
a first conductive pattern including nickel and chromium;
a second conductive pattern disposed on the first conductive pattern and including copper; and
a third conductive pattern disposed on the second conductive pattern and including copper.

8. The flexible circuit board of claim 1, further comprising:
at least one first via passing through the first substrate and connecting the first conductive pattern part to the third conductive pattern part; and
at least one second via passing through the second substrate and connecting the second conductive pattern part and the third conductive pattern part,
wherein each of the first and second vias includes:
a first via layer disposed on an inner wall of a via hole which is formed through the first substrate or the second substrate, and including palladium; and
a second via layer disposed in the first via layer to fill the via hole, and including copper.

9. The flexible circuit board of claim 1, wherein a thickness of the first substrate is thicker than a thickness of the second substrate.

10. The flexible circuit board of claim 7, further comprising a lower protective layer partially disposed under the first conductive pattern part and including a third open region,
wherein the first conductive pattern part includes:
first and second outer lead pattern parts exposed through the third open region, and
a third extension pattern part connected to the first and second outer lead pattern parts.

11. The flexible circuit board of claim 1, wherein the second conductive pattern part further includes a third inner lead pattern part exposed through a second open region of the upper protective layer, and
a total number of the second and third inner lead pattern parts is smaller than the total number of the first inner lead pattern parts.

12. The flexible circuit board of claim 6, wherein the first inner lead pattern part of the third conductive pattern part includes the conductive pattern layer, the first plating layer and the second plating layer, and
wherein the first extension pattern part includes the conductive pattern layer,
wherein the conductive pattern layer of the first extension pattern part is covered by the second substrate.

13. The flexible circuit board of claim 6, wherein the second inner lead pattern part of the second conductive pattern part includes the conductive pattern layer, the first plating layer and the second plating layer, and
wherein the second extension pattern part includes the conductive pattern layer,
wherein the conductive pattern layer of the second extension pattern part is covered by the upper protective layer.

14. The flexible circuit board of claim 6, wherein the second inner lead pattern part of the second conductive pattern part includes the conductive pattern layer, the first plating layer and the second plating layer, and
wherein the second extension pattern part includes the conductive pattern layer and the first plating layer,
wherein the first plating layer of the second extension pattern part is covered by the upper protective layer.

15. The flexible circuit board of claim 10, wherein each of the first and second outer lead pattern parts of the first conductive pattern part includes the conductive pattern layer, the first plating layer and the second plating layer, and
wherein the third extension pattern part includes the conductive pattern layer,
wherein the conductive pattern layer of the third extension pattern part is covered by the lower protective layer.

16. The flexible circuit board of claim 10, wherein each of the first and second outer lead pattern parts of the first conductive pattern part includes the conductive pattern layer, the first plating layer and the second plating layer, and wherein the third extension pattern part includes the conductive pattern layer and the first plating layer,
wherein the first plating layer of the third extension pattern part is covered by the lower protective layer.

\* \* \* \* \*